(12) United States Patent
Kinoshita et al.

(10) Patent No.: US 8,357,580 B2
(45) Date of Patent: Jan. 22, 2013

(54) SEMICONDUCTOR DEVICE AND METHOD OF MANUFACTURING SEMICONDUCTOR DEVICE

(75) Inventors: Atsuhiro Kinoshita, Kamakura (JP); Yoshinori Tsuchiya, Yokohama (JP); Junji Koga, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 147 days.

(21) Appl. No.: 12/618,402

(22) Filed: Nov. 13, 2009

(65) Prior Publication Data

US 2010/0062575 A1    Mar. 11, 2010

Related U.S. Application Data

(60) Continuation of application No. 12/193,668, filed on Aug. 18, 2008, now abandoned, which is a division of application No. 11/211,746, filed on Aug. 26, 2005, now abandoned.

(30) Foreign Application Priority Data

Jan. 27, 2005 (JP) .................................. 2005-19293

(51) Int. Cl.
  *H01L 21/336* (2006.01)
  *H01L 21/4763* (2006.01)
(52) U.S. Cl. ....................... 438/300; 438/592
(58) Field of Classification Search .......... 438/300–305, 438/587–592, 655–657, E27.064
  See application file for complete search history.

(56) References Cited

U.S. PATENT DOCUMENTS

| 6,372,640 | B1 * | 4/2002 | Chen et al. ..................... 438/656 |
| 6,512,258 | B2 | 1/2003 | Maeda |
| 6,599,805 | B2 * | 7/2003 | Trivedi .......................... 438/305 |
| 6,713,779 | B2 * | 3/2004 | Tezuka et al. .................. 257/19 |

OTHER PUBLICATIONS

Kakumu et al., "Work Function Controlled Silicide Technology for Submicron CMOS," *Tecyical Digest of VLSI Symposia on Technology*, pp. 30-31 (1984).
Kedzierski et al., "Issues in NiSI-gated FDSOI Device Integration," *Technical Digest of International Electron Devices Meeting, IEEE*, pp. 441(1-4), (2003).
Kinoshita et al., "Field Effect Transistor and Manufacturing Method Thereof," U.S. Appl. No. 10/933,333, filed Sep. 3, 2004.
Tavel, B. et al., "Totally Silicided (CoSi2) Polysilicon: A novel Approach to Very Low-Resistive Gat," *IEEE*, pp. 37.5.1-37.5.4 (2001).

* cited by examiner

*Primary Examiner* — Cuong Q Nguyen
(74) *Attorney, Agent, or Firm* — Finnegan, Henderson, Farabow, Garrett & Dunner, L.L.P.

(57) ABSTRACT

A semiconductor device includes a semiconductor substrate; a first gate insulation film formed on the semiconductor substrate; a second gate insulation film formed on the semiconductor substrate; a first gate electrode formed on the first gate insulation film and fully silicided; and a second gate electrode formed on the second gate insulation film and fully silicided, a gate length or a gate width of the second gate electrode being larger than that of the first gate electrode, and a thickness of the second gate electrode being smaller than that of the first gate electrode.

7 Claims, 37 Drawing Sheets

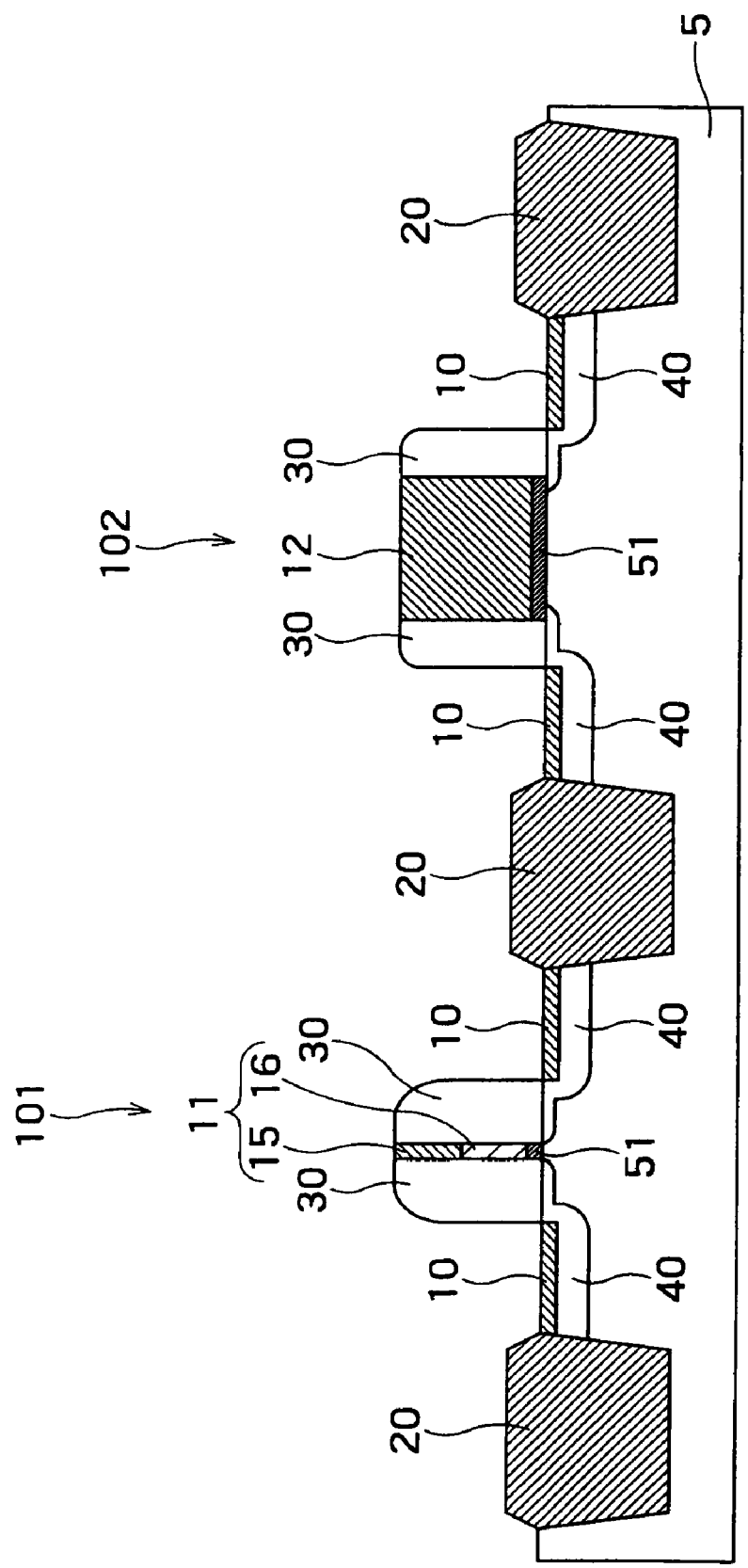

SEMICONDUCTOR DEVICE AND METHOD OF MANUFACTURING SEMICONDUCTOR DEVICE

CROSS-REFERENCE TO RELATED APPLICATION

This is a continuation of application Ser. No. 12/193,668, filed Aug. 18, 2008 (abandoned), which is a divisional of application Ser. No. 11/211,746, filed Aug. 26, 2005 (abandoned), and claims the benefit of priority to Japanese Application No. 2005-19293, filed Jan. 27, 2005, the entire contents of all of which are incorporated herein by reference.

BACKGROUND OF THE INVENTION

1. Field of the Invention

The present invention relates to a semiconductor device and a method of manufacturing the semiconductor device.

2. Background Art

In order to obtain a high-performance CMIS device, micropatterning of devices advances. With the micropatterning of devices, gate oxide films are reduced in thickness. when a gate electrode consists of polysilicon, a reduction in thickness of the gate oxide film disadvantageously depletes a gate electrode in switching of a gate electrode. When the thickness of the gate oxide film is lower than 1 nm, a percentage of a depletion capacity of the gate electrode to the capacity of the gate oxide film reaches 30%.

In order to cope with this problem, a technique used in a gate electrode consisting of a metal is proposed in place of a gate electrode consisting of polysilicon. For example, an FUSI (Fully-Silicide Gate) technique that completely silicides a gate electrode is known (see M. Kakumu et al., VLSI Tech. Dig. (1984), p. 30).

However, it is known that, when gate electrodes having various gate lengths or gate widths are formed on the same semiconductor substrate, all the gate electrodes cannot be easily fully silicided (see J. Kedzierski et al., IEDM Tech. Dig. (2003)). A gate electrode having a small gate length or a small gate width can be easily fully silicided due to a reverse thin-line effect. However, in contrast to this, a gate electrode having a large gate length and a large gate width tends to be silicided. In particular, since nickel has a large diffusion coefficient on an interface between the gate electrode and a side wall, the reverse thin-line effect becomes conspicuous. When a gate electrode, which is fully silicided, and a gate electrode, which is not fully silicided, are arranged on the same chip, the operation of the semiconductor device disadvantageously fluctuates.

The gate electrodes having different gate lengths or gate widths can be fully silicided by silicidation steps adapted to gate electrodes are repeated. However, such a method makes manufacturing processes cumbersome and elongates a manufacturing period. As a result, the cost of the semiconductor increases.

Therefore, a semiconductor device obtained by fully siliciding gate electrodes having different gate lengths or different gate widths to solve the above problem is desired. Further, a semiconductor device manufacturing method fully siliciding gate electrodes independent of the gate lengths or different gate widths.

SUMMARY OF THE INVENTION

An advantage of an aspect of the present invention is to provide a semiconductor device obtained by fully siliciding gate electrodes having different gate lengths or different gate widths to solve the above problem, and to provide a semiconductor device manufacturing method fully siliciding gate electrodes independent of the gate lengths or different gate widths.

A semiconductor device according to an embodiment of the present invention comprises a semiconductor substrate; a first gate insulation film formed on the semiconductor substrate; a second gate insulation film formed on the semiconductor substrate; a first gate electrode formed on the first gate insulation film and fully silicided; and a second gate electrode formed on the second gate insulation film and fully silicided, a gate length or a gate width of the second gate electrode being larger than that of the first gate electrode, and a thickness of the second gate electrode being smaller than that of the first gate electrode.

A semiconductor device according to an embodiment of the present invention comprises a semiconductor substrate; a first gate insulation film formed on the semiconductor substrate; a second gate insulation film formed on the semiconductor substrate; a first gate electrode formed on the first gate insulation film and fully silicided; and a second gate electrode including a plurality of sub-gate electrodes formed on the second gate insulation film, the second gate electrode having a gate length or a gate width larger than that of the first gate electrode, wherein the plurality of sub-gate electrodes are fully silicided.

A semiconductor device according to an embodiment of the present invention comprises a semiconductor substrate; a first gate insulation film formed on the semiconductor substrate; a second gate insulation film formed on the semiconductor substrate; a first gate electrode formed on the first gate insulation film and fully silicided; a second gate electrode including particles and provided on the second gate insulation film and fully silicided, the area of the semiconductor substrate occupied by the second gate electrode being larger than that of the first gate electrode.

A method of manufacturing a semiconductor device according to an embodiment of the present invention comprises preparing a semiconductor substrate having a first surface region and a second surface region; epitaxially growing a semiconductor region on the second surface region; forming a first gate insulation film on the first surface region and forming a second gate insulation film on the semiconductor region; forming a first gate electrode on the first gate insulation film, and forming a second gate electrode on the second gate insulation film, the second gate electrode having a height equal to that of the first gate electrode and having a width larger than that of the first gate electrode; depositing a metal film on the first gate electrode and on the second gate electrode; and fully siliciding the first gate electrode and the second gate electrode.

A method of manufacturing a semiconductor device according to an embodiment of the present invention comprises preparing a semiconductor substrate having a first surface region and a second surface region; etching the semiconductor substrate of the first surface region; forming a first gate electrode on the first gate insulation film, and forming a second gate electrode on the second gate insulation film; forming a first gate electrode on the first gate insulation film, and forming a second gate electrode on the second gate insulation film, the second gate electrode having a height equal to that of the first gate electrode and having a width larger than that of the first gate electrode; covering source and drain diffusion layers or silicide electrodes with an interlayer insulation film, the source and drain diffusion layers or the silicide electrodes being formed on both sides of the first gate electrode and on both sides of the second gate electrode; polishing the interlayer insulation film to expose the upper surface of the first gate electrode and the upper surface of the second gate electrode; depositing a metal film on the first gate electrode and on the second gate electrode; and fully siliciding the first gate electrode and the second gate electrode.

A method of manufacturing a semiconductor device according to an embodiment of the present invention comprises preparing a semiconductor substrate having a first surface region and a second surface region; forming a first gate insulation film on the first surface region and forming a second gate insulation film on the second surface region; depositing a gate electrode material on the first and second gate insulation films; etching the gate electrode material on the first gate insulation film to form a first gate electrode and etching the gate electrode material on the second gate insulation film to form a second gate electrode which includes a plurality of sub-gate electrodes arranged on the second gate insulation film and which occupies an area larger than an area occupied by the first gate electrode on the semiconductor substrate; depositing a metal film on the first gate electrode and the second gate electrode; and fully siliciding the first gate electrode and the second gate electrode.

A method of manufacturing a semiconductor device according to an embodiment of the present invention comprises preparing a semiconductor substrate having a first surface region and a second surface region; forming a first gate insulation film on the first surface region and forming a second gate insulation film on the second surface region; depositing a gate electrode material on the first and second gate insulation films; implanting oxygen into the gate electrode material on the second gate insulation film; annealing the gate electrode material to form particles in the gate electrode material on the second gate insulation film; forming a first gate electrode on the first gate insulation film, and forming a second gate electrode on the second gate insulation film, the second gate electrode having a width larger than that of the first gate electrode; depositing a metal film on the first gate electrode and the second gate electrode; and fully siliciding the first gate electrode and the second gate electrode.

BRIEF DESCRIPTION OF THE DRAWINGS

FIG. 37 is a sectional diagram of a semiconductor device 1100 according to an eleventh embodiment of the present invention.

DETAILED DESCRIPTION OF THE INVENTION

Embodiments according to the present invention will be described below with reference to the accompanying drawings. The embodiments do not limit the present invention. In the following embodiments, constituent elements consisting of p-type semiconductor may be replaced with elements consisting of n-type semiconductor, constituent elements consisting of n-type semiconductor may be replaced with elements consisting of p-type semiconductor.

(First Embodiment)

Figure 1:
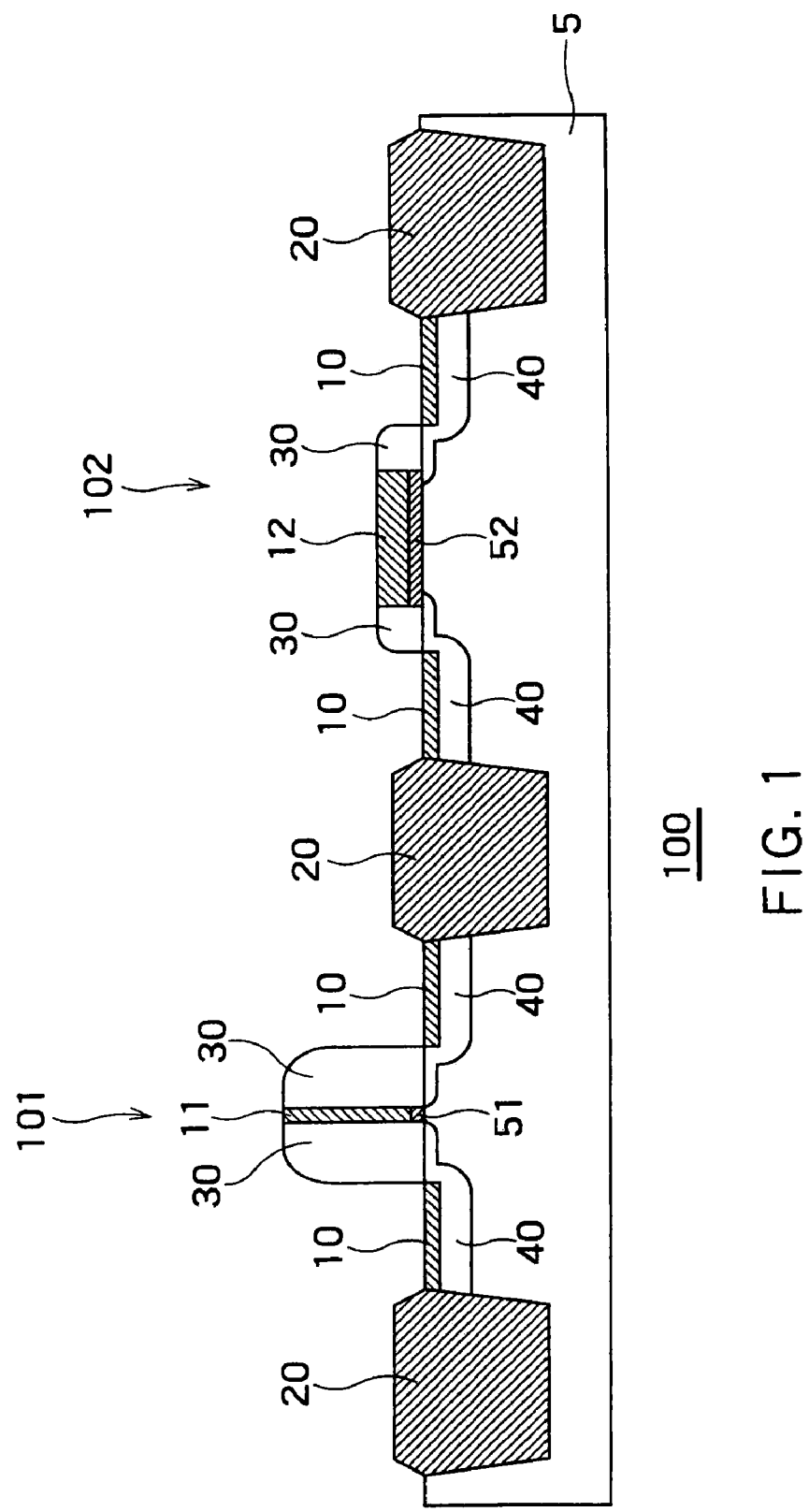
FIG. 1 is a sectional diagram of a semiconductor device 100 according to the first embodiment of the present invention.

FIG. 1 is a sectional diagram of a semiconductor device 100 according to the first embodiment of the present invention. FIG. 1 shows two MIS transistors 101 and 102 having lengths different from each other. It is assumed that the gate widths of the MIS transistor 101 and the MIS transistor 102 are equal to each other. The MIS transistors 101 and 102 may be p-type transistors or n-type transistors. In the first embodiment, gate electrodes are controlled in thickness to fully silicide a plurality of gate electrodes having different gate lengths.

The semiconductor device 100 includes a semiconductor substrate 5, a source-drain silicide layer 10, an STI (Shallow Trench Isolation) 20, a side wall 30, a source-drain diffusion layer 40, a first gate insulation film 51, a second gate insulation film 52, a first gate electrode 11, and a second gate electrode 12.

The STI 20 performs device isolation between the MIS transistors 101 and 102. The first gate insulation film 51 and the second gate insulation film 52 are formed on the surface of the semiconductor substrate 5. The first gate electrode 11 is formed on the first gate insulation film 51. The second gate electrode 12 is formed on the second gate insulation film 52.

The gate length of the second gate electrode 12 is larger than the gate length of the first gate electrode 11, and the gate width of the second gate electrode 12 is equal to the gate width of the first gate electrode 11. Therefore, when viewed from above the surface of the semiconductor substrate 5, the surface area of the second gate electrode 12 is larger than the surface area of the first gate electrode 11. In other words, an area of the semiconductor substrate 5 occupied by the second gate electrode 12 is larger than that of the first gate electrode 11. The thickness of the first gate electrode 11 is larger than that of the second gate electrode 12. This is because the resistance of the first gate electrode 11 is prevented from being considerably higher than that of the resistance of the second gate electrode 12.

The semiconductor substrate 5 is, e.g., a p-type silicon substrate. The thicknesses of the first and second gate insulation films 51 and 52 are preferably 2 nm or less, for example. The first and second gate insulation films 51 and 52 may be silicon oxide films, for example. The first and second gate insulation films 51 and 52 may be high-dielectric-constant insulation films having dielectric constants higher than that of a silicon oxide film. The first and second gate insulation films 51 and 52 may consist of $Si_3N_4$, $Al_2O_3$, $Ta_2O_5$, $TiO_2$, $La_2O_5$, $CeO_2$, $ZrO_2$, $HfO_2$, $SrTiO_3$, $Pr_2O_3$, or the like. The first and second gate insulation films 51 and 52 may consist of materials such as Zr silicate or Hf silicate obtained by mixing metal ions in silicon oxides and may consist of a material obtained by mixing these materials (e.g. Zr silicate and Hf silicate). The first and second gate insulation films 51 and 52 may consist of a material such as HfSiON obtained by mixing nitrogen in a high-dielectric-constant insulation film. When nitrogen is mixed in the high-dielectric-constant insulation film, the heat resistance of the gate insulation film is improved. Therefore, a gate electrode structure can be easily manufactured.

The gate electrodes 11 and 12 consist of nickel silicide, for example. The gate length of the first gate electrode 11 is about 30 nm, and the gate length of the second gate electrode 12 is about 100 nm. The thickness (height) of the first gate electrode 11 is about 50 nm, and the thickness (height) of the second gate electrode 12 is about 20 nm.

It is reported that the reverse thin-line effect occurs when a gate length is 50 nm or less. Therefore, the gate length of the first gate electrode is shorter than 50 nm, and the gate length of the second gate electrode is longer than 50 nm.

The source-drain layer 40 is formed to sandwich the first and second gate electrodes 11 and 12. The source-drain layer 40 consists of a high-concentration n-type semiconductor, for example. The nickel silicide layer 10 is formed on the upper portion of the source-drain layer 40. The nickel silicide layer 10 consists of nickel silicide and connects the source-drain layer to a source-drain electrode (not shown) with a low resistance.

The side walls 30 are adjacently formed on the side walls of the first gate electrode 11 and the second gate electrode 12, respectively. The side wall 30 is constituted by a silicon oxide film or a silicon nitride film, for example.

In this manner, the semiconductor device 100 according to the embodiment has gate lengths different from each other and includes a plurality of gate electrodes which are fully silicided.

FIGS. 2 to 5 are sectional flow diagrams showing a flow of a manufacturing method of the semiconductor device 100 according to the first embodiment. The manufacturing method of the semiconductor device 100 will be described below with reference to FIGS. 2 to 5.

Figure 2:
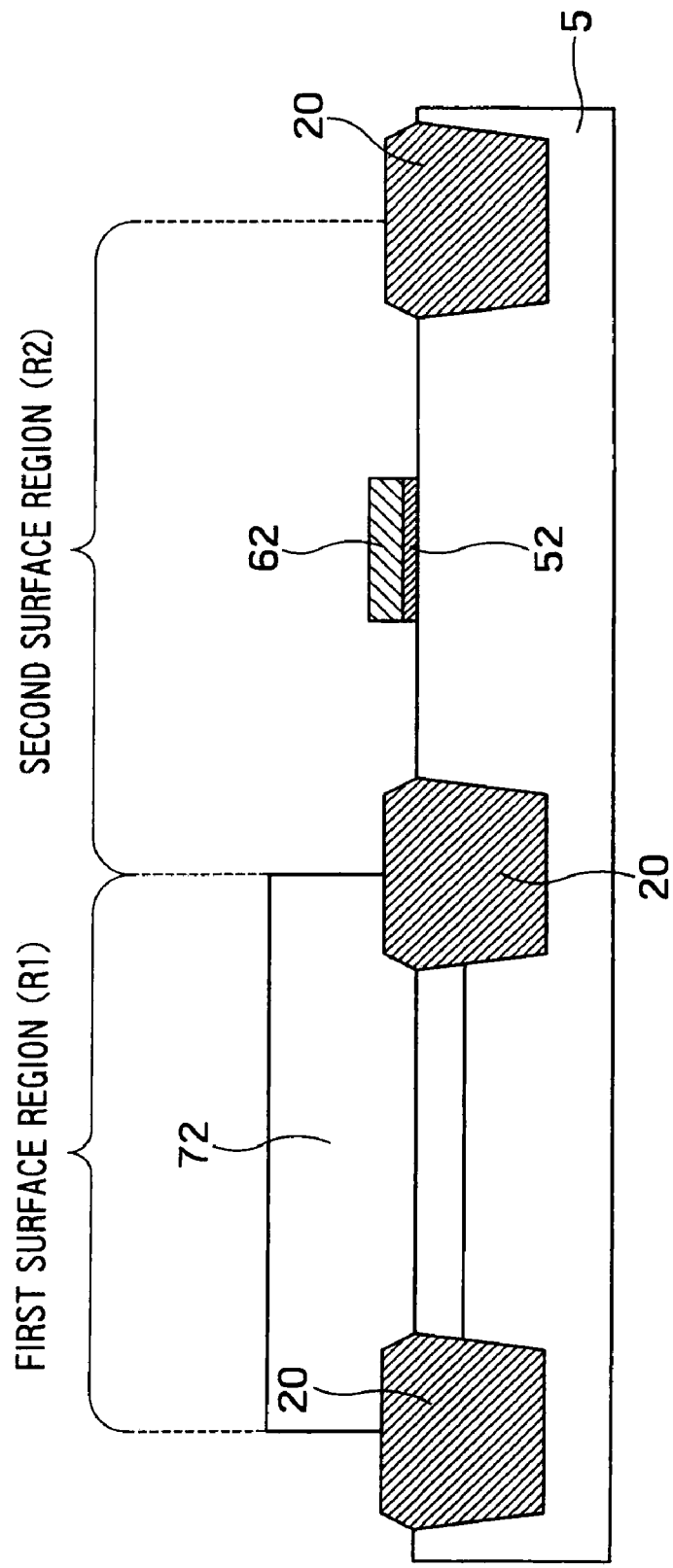
FIG. 2 is a sectional diagram showing a manufacturing method of the semiconductor device 100 according to the first embodiment.

As shown in FIG. 2, the semiconductor substrate 5 having a first surface region R1 and a second surface region R2 is prepared. A trench is formed in a device isolation region, and a silicon oxide film is filled in the trench. In this manner, the STI 20 is formed. By using a photography technique, the first surface region R1 is covered with a hard mask material 72, which consists of e.g. silicon nitride to expose only the second surface region R2. A silicon thermal oxide film and a polysilicon film are continuously formed. At this time, the thickness of the deposited polysilicon film is about 20 nm. Subsequently, by using the photolithography technique and an RIE (Reactive Ion Etching) method, the second gate insulation film 52 and a second gate electrode 62 are formed. At this time, the second gate electrode 62 is micropatterned by using a slimming technique to make the gate length of the second gate electrode 62 about 100 nm. Thereafter, the hard mask material 72 is removed by, e.g., heated phosphoric acid or the like.

Figure 3:
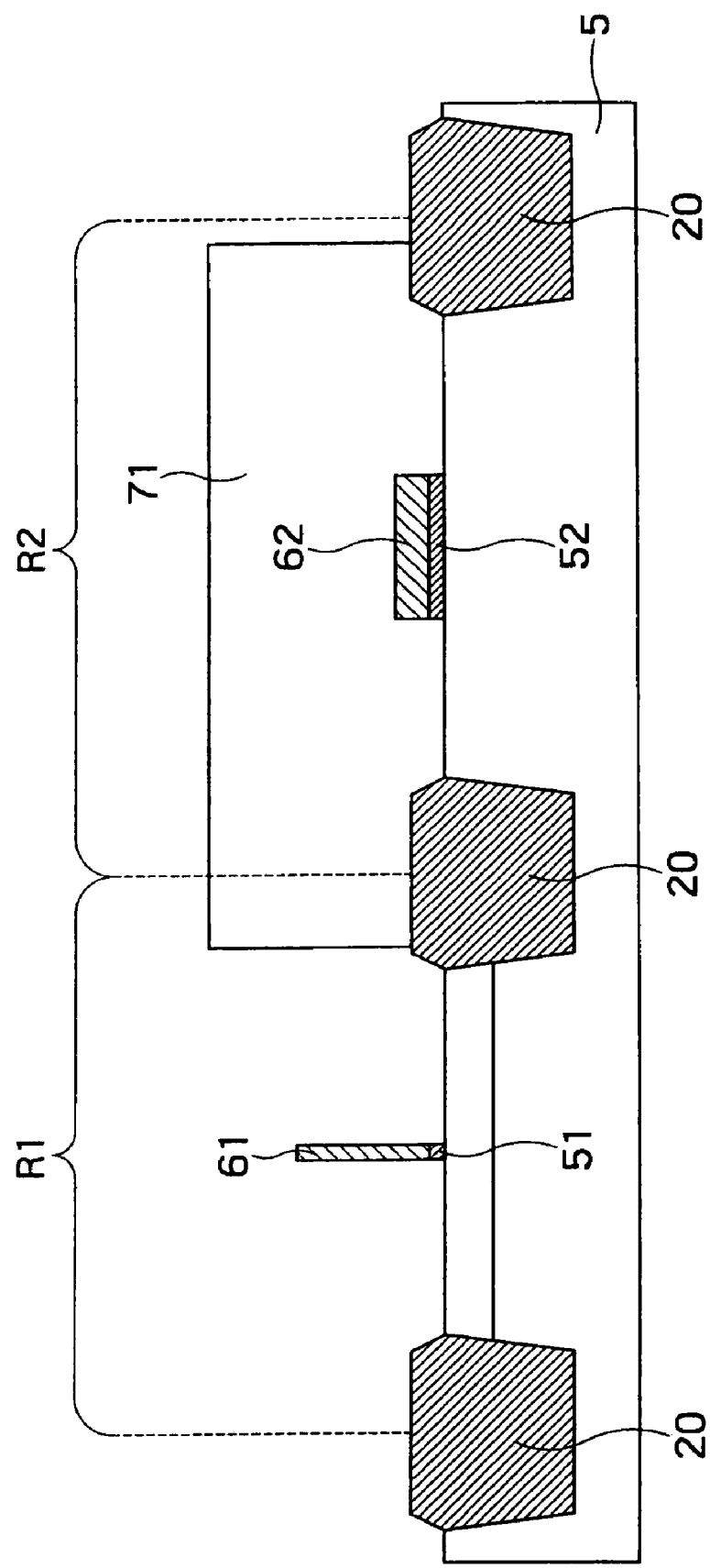
FIG. 3 is a sectional diagram following FIG. 2.

As shown in FIG. 3, the second surface region R2 is covered with a hard mask material 71 consisting of e.g. silicon nitride by using the photography technique to expose only the first surface region R1. Subsequently, the first gate insulation film 51 and a first gate electrode 61 are formed through the same steps as those of the second gate insulation film 52 and the second gate electrode 62. However, when the first gate electrode 61 is formed, the thickness of a deposited polysilicon film is about 50 nm. The gate length of the first gate electrode 61 is set at about 30 nm. At this time, the first and second gate electrodes consist of polysilicon but silicide. Therefore, the reference numerals of the first and second gate electrodes are defined as 61 and 62, respectively. Thereafter, the hard mask material 71 is removed by using heated phosphoric acid.

Figure 4:
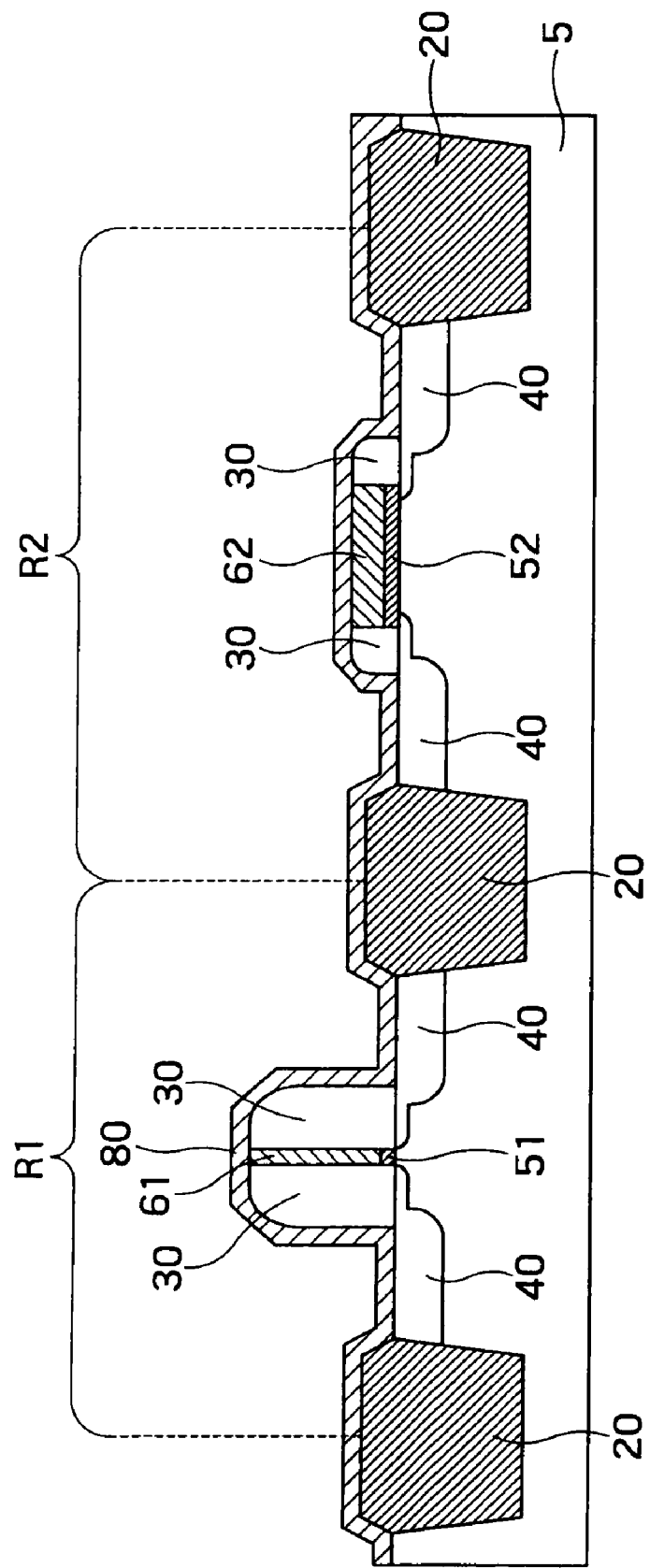
FIG. 4 is a sectional diagram following FIG. 3.

As shown in FIG. 4, the side walls 30 are formed on the side walls of the first and second gate electrodes 61 and 62, respectively. The source-drain layer 40 is formed. In order to form the source-drain layer 40, ion implantation or plasma doping may be used. Subsequently, nickel is deposited on the entire surface of the semiconductor substrate 5. At this time, the thickness of the nickel film is about 12 nm.

When the gate length of the second gate electrode 62 is so long that a reverse thin-line effect cannot be obtained, the thickness of the nickel film required for full-siliciding the second gate electrode 62 is about 0.55 times of the thickness of the polysilicon of the second gate electrode 62. More specifically, the thickness of the nickel film may be smaller than almost half of the thickness of the polysilicon of the second gate electrode 62. Therefore, in this embodiment, the thickness of the nickel film may be about 12 nm.

Figure 5:
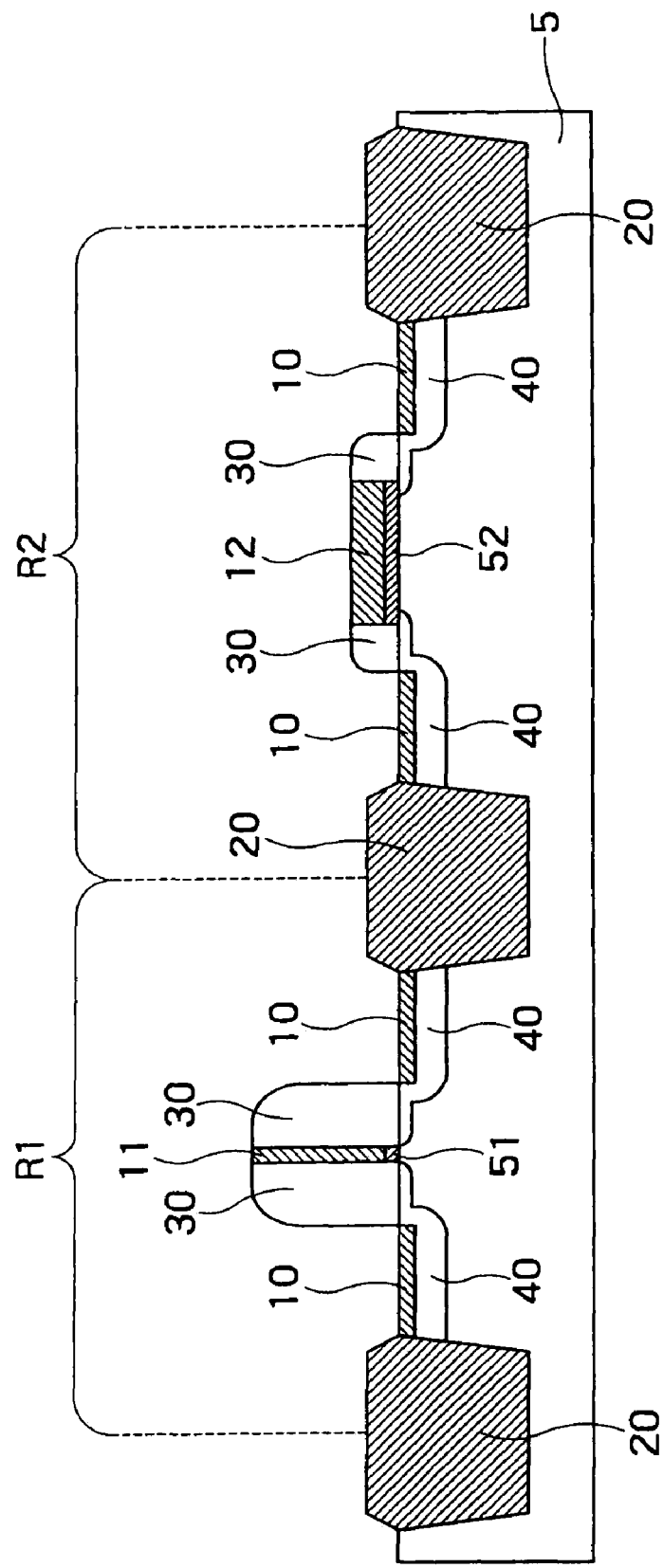
FIG. 5 is a sectional diagram following FIG. 4.

Lamp annealing is executed at 450° for 60 seconds. At this time, as shown in FIG. 5, the first gate electrode 61 is fully silicided by the reverse thin-line effect. The second gate electrode 62 is fully silicided because the second gate electrode 62 has a sufficiently small thickness. In this manner, the first and second gate electrodes 11 and 12 which are fully silicided are formed. At the same time, the source-drain silicide layer 10 may be formed.

In the annealing step, nickel is rapidly diffused in an interface between the first gate electrode 61 and the side wall 30. For this reason, the first gate electrode 61 is fully silicided to its bottom. This phenomenon is called a "reverse thin-line effect".

In the first embodiment, on the semiconductor substrate 5, a plurality of gate electrodes having different gate lengths can be fully silicided in the same steps.

(Second Embodiment)

Figure 6:
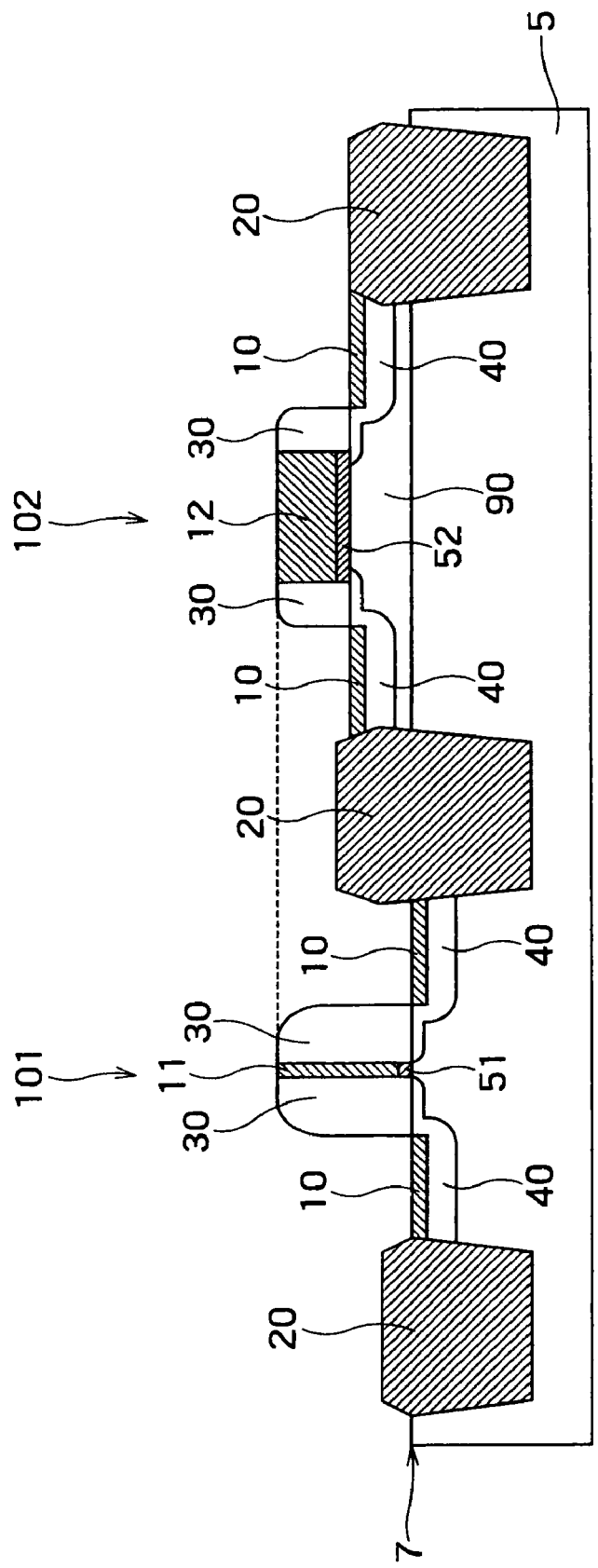
FIG. 6 is a sectional diagram of a semiconductor device 200 according to the second embodiment of the present invention.

FIG. 6 is a sectional diagram of a semiconductor device 200 according to the second embodiment of the present invention. In the second embodiment, an MIS transistor 102 is formed on a semiconductor region 90 formed on a semiconductor substrate 5. Therefore, the bottom surface of the second gate electrode 12 is set at a higher level from the surface 7 of the semiconductor substrate 5 than the bottom surface of the first gate electrode 11. As a result, the upper surface of the second gate electrode 12 can be set at a level equal to the upper surface of the first gate electrode 11, and the thickness of the second gate electrode 12 is smaller than the thickness of the first gate electrode 11. The other constitution in the second embodiment may be the same as that in the first embodiment.

The semiconductor region 90 consists of, e.g., silicon single crystal. The thickness of the semiconductor region 90 may be equal to a difference between the thickness of the first gate electrode 11 and the thickness of the second gate electrode 12. For example, if the thickness of the first gate electrode 11 and the thickness of the second gate electrode 12 are 100 nm and 40 nm, respectively, the thickness of the semiconductor region 90 is 60 nm.

The level of the upper surface of the second gate electrode 12 and the level of the upper surface of the first gate electrode 11 are made equal to each other to make it possible to easily execute CMP (Chemical-Mechanical Polishing) in manufacturing of the semiconductor device 200.

FIGS. 7 to 10 are sectional flow diagrams showing a flow of a manufacturing method of the semiconductor device 200 according to the second embodiment. The manufacturing method of the semiconductor device 200 will be described below with reference to FIGS. 7 to 10.

Figure 7:
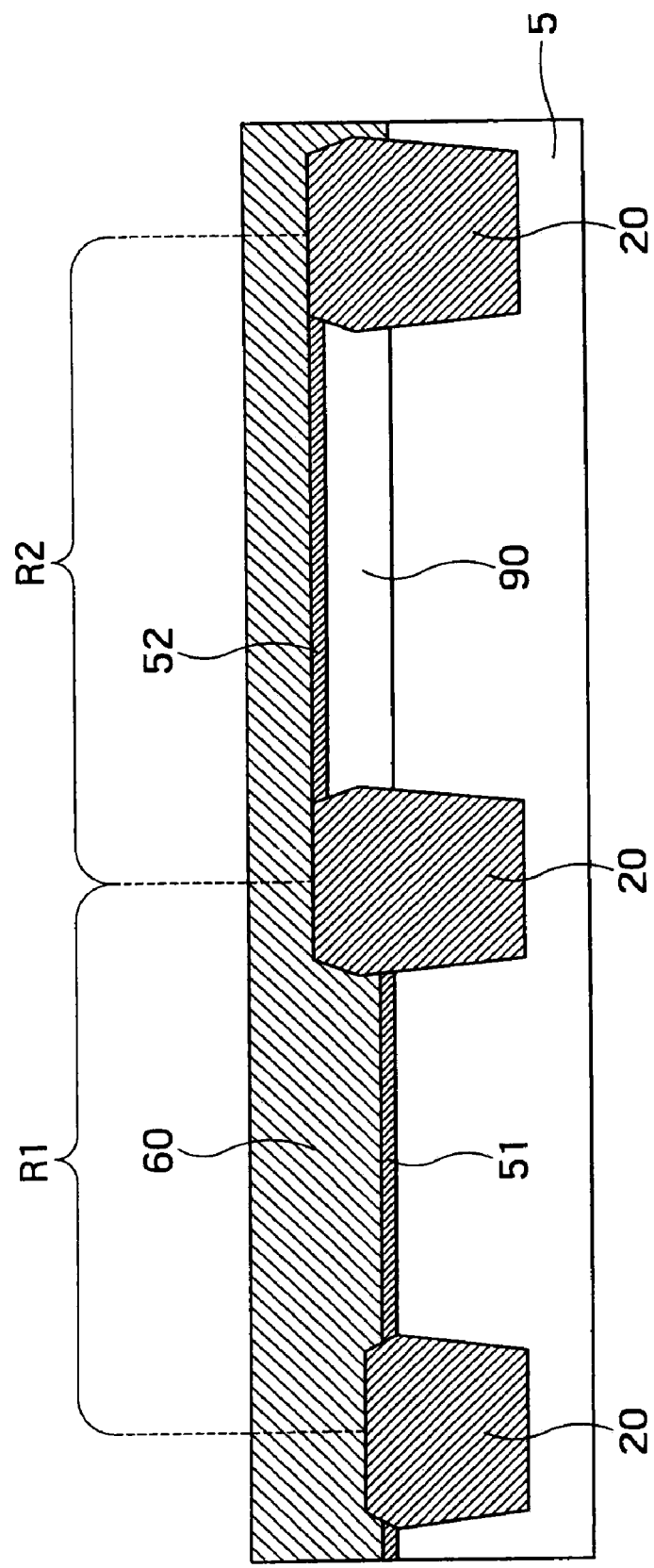
FIG. 7 is a sectional diagram showing a manufacturing method of the semiconductor device 200 according to the second embodiment.

By using a photolithography technique and a selective epitaxial growing method for silicon single crystal, as shown in FIG. 7, the semiconductor region 90 is formed in a second surface region R2 of the semiconductor substrate 5. The thickness of the semiconductor region 90 is about 60 nm, for example.

The STI 20 is formed in the same manner as that of the first embodiment. The silicon thermal oxide films 51 and 52 and a polysilicon film 60 are continuously formed. Subsequently, the surface of the polysilicon film 60 is planarized by using CMP. In this manner, the levels of the upper surfaces of the first and second gate electrodes 61 and 62 can be made equal to each other.

Figure 8:
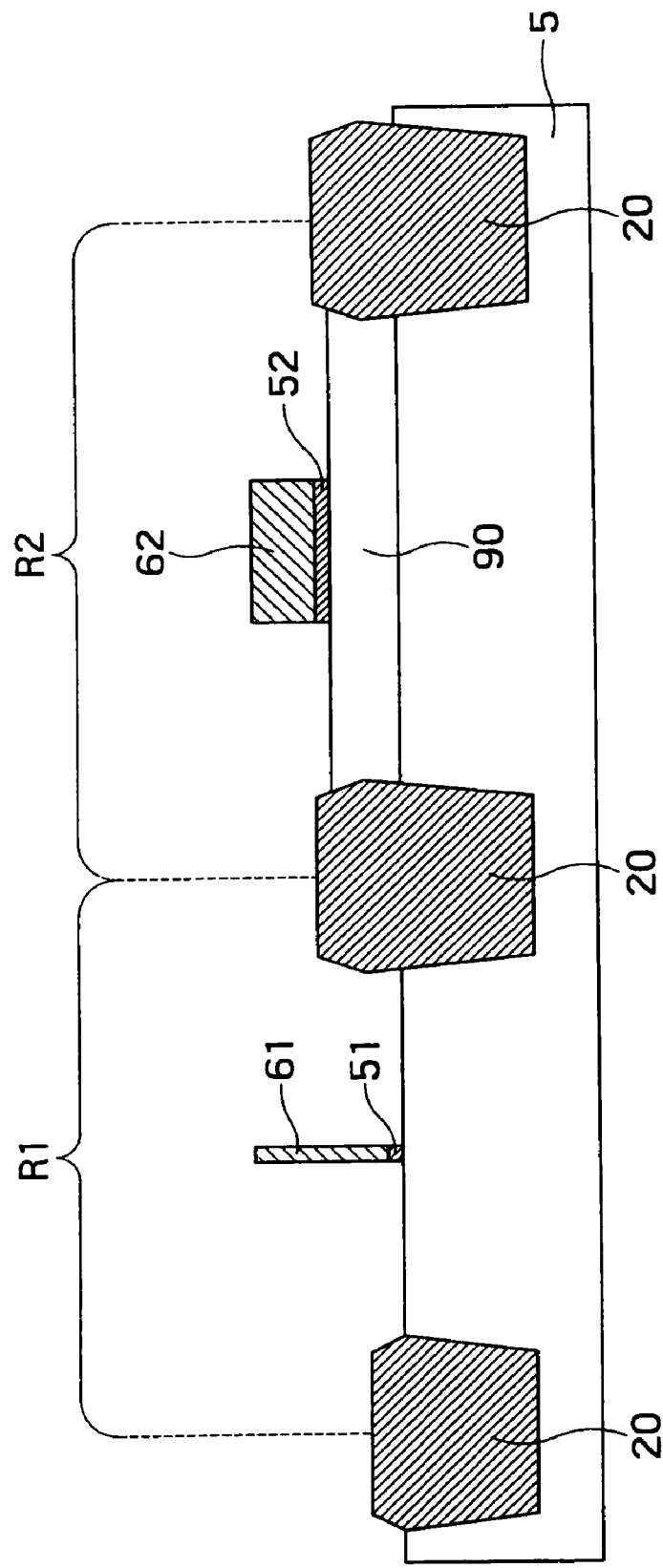
FIG. 8 is a sectional diagram following FIG. 7.

As shown in FIG. 8, by using an RIE method and a slimming technique, the first gate electrode 61 and the second gate electrode 62 are formed. The gate length of the first gate electrode 61 may be about 30 nm. The gate length of the second gate electrode 62 may be about 100 nm. The thickness of the first gate electrode 11 is 100 nm, for example. The thickness of the second gate electrode 12 is 40 nm, for example.

Figure 9:
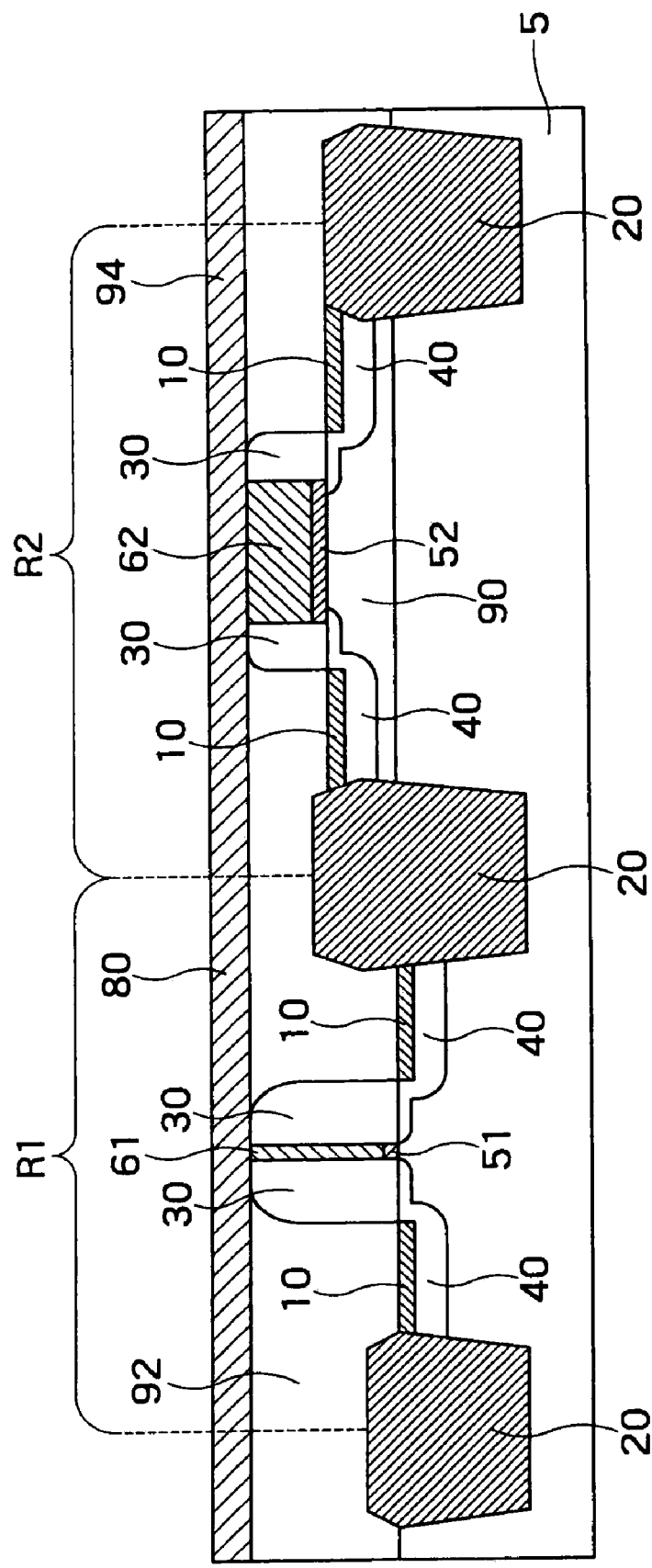
FIG. 9 is a sectional diagram following FIG. 8.

As shown in FIG. 9, the side wall 30 and the source-drain diffusion layer 40 are formed same as in the first embodiment. Nickel is deposited on the entire surface of the semiconductor substrate 5. At this time, the thickness of the nickel film is about 8 nm. Subsequently, the source-drain silicide layer 10 is formed on the upper portion of the source-drain layer 40 by using lamp annealing. At this time, the upper portions of the first and second gate electrodes 11, 12 are also silicided.

An insulating interlayer 92 is deposited on the entire surface of the semiconductor substrate 5. The insulating interlayer 92 consists of, for example, BPSG. Subsequently, the insulating interlayer 92 is planarized by using CMP to expose the upper surfaces of the first and second gate electrode.

Figure 10:
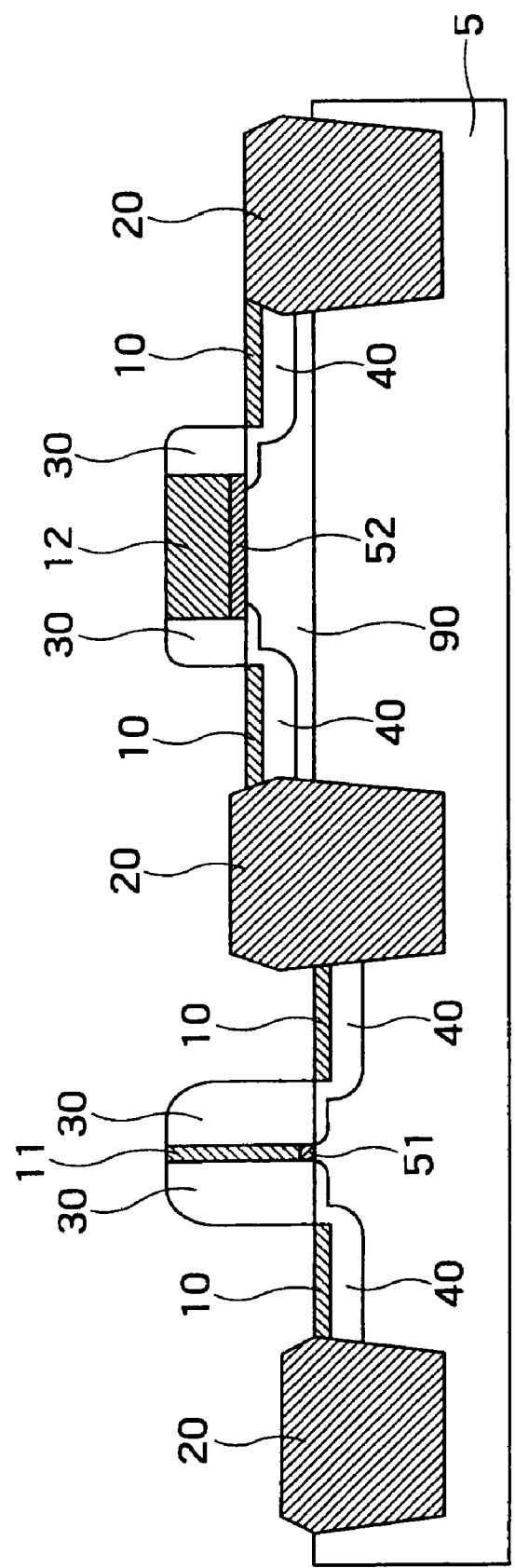
FIG. 10 is a sectional diagram following FIG. 9.

A nickel film 80 is deposited on the entire surface of the semiconductor substrate 5. As described above, since the upper portions of the first and second gate electrodes 61 and 62 are silicided to some extent, the thickness of the nickel film 80 may be smaller than the nickel film in the first embodiment. Therefore, the thickness of the nickel film may be about 20 nm, for example. Subsequently, lamp annealing is executed at 450° C. for 60 seconds. At this time, as shown in FIG. 10, the first gate electrode 61 is fully silicided by a reverse thin-line effect. The second gate electrode 62 is fully silicided because the second gate electrode 62 is sufficiently thin.

In the second embodiment, the upper surfaces of the first and second gate electrodes 61 and 62 can be exposed while covering the source-drain layer 40 with the insulating interlayer 92. Therefore, the silicidation step of the source-drain silicide layer 10 and the silicidation step of the first and second gate electrodes 11 and 12 can be executed as different steps.

In the second embodiment, the position of the bottom surface of the second gate electrode 12 is raised by the semiconductor region 90. In this manner, the levels of the upper surfaces of the first and second gate electrodes 11 and 12 are made equal to each other. Alternatively, the semiconductor substrate 5 of the first surface region R1 may be etched to lower the position of the bottom surface of the first gate electrode 11. By using this method, the levels of the upper surfaces of the first and second gate electrodes 11 and 12 can be made equal to each other.

Furthermore, these methods are combined to each other to raise the bottom surface of the second gate electrode 12 by the semiconductor region 90 and to lower the position of the level of the first gate electrode 11.

(Third Embodiment)

Figure 11:
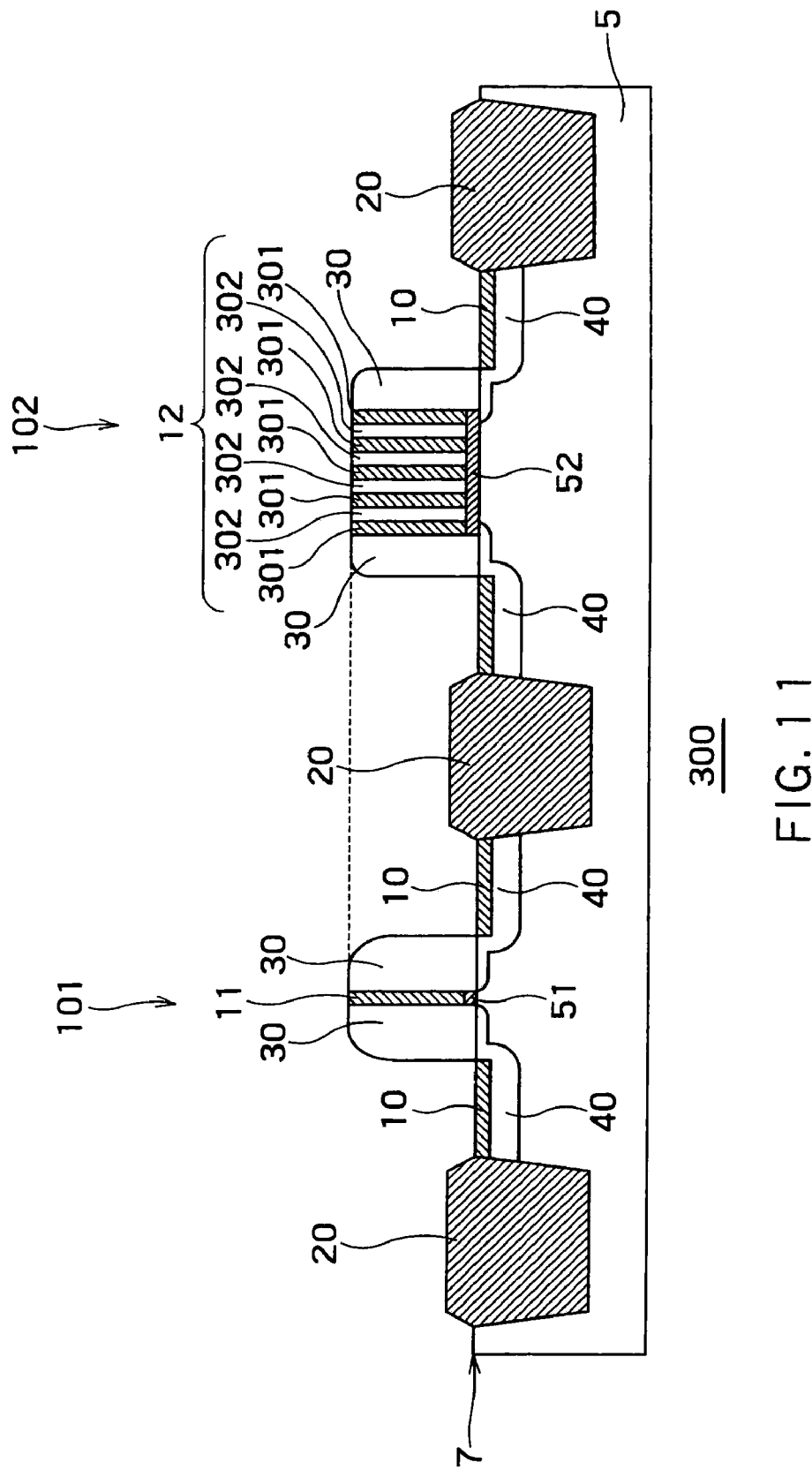
FIG. 11 is a sectional diagram of a semiconductor device 300 according to the third embodiment of the present invention.

FIG. 11 is a sectional diagram of a semiconductor device 300 according to the third embodiment of the present invention. In the third embodiment, a second gate electrode 12 includes a plurality of sub-gate electrodes 301 and a plurality of inter-electrode insulation films 302. The plurality of sub-gate electrodes 301 are parallel formed on a second gate insulation film. The inter-electrode insulation film 302 is formed between the adjacent sub-gate electrodes 301. Therefore, the sub-gate electrodes 301 and the inter-electrode insulation films 302 are alternately formed to give the appearance that the sub-gate electrodes 301 and the inter-electrode insulation films 302 have a striped shape on the section or the upper surface.

The gate length of the first gate electrode 11 is 20 nm, for example. The gate length of the second gate electrode 12 is 120 nm, for example. The width of the sub-gate electrode 301 is 20 nm, for example. The width of the inter-electrode insulation film 302 is 5 nm, for example. In the third embodiment, the five sub-gate electrodes 301 are arranged, and the four inter-electrode insulation films 302 are arranged between these sub-gate electrodes 301. The heights of the first gate electrode 11 and the second gate electrode 12 are, for example, 50 nm each.

The other configuration in the third embodiment may be the same as that in the first embodiment.

In the third embodiment, reverse thin-line effects occur in both the first and second gate electrodes 11 and 12, respectively. Therefore, even though the thickness of the second gate electrode 12 is equal to the thickness of the first gate electrode 11, both the first and second gate electrodes 11 and 12 can be fully silicided.

FIGS. 12 to 15 are sectional flow diagrams showing a flow of a manufacturing method of the semiconductor device 300 according to the third embodiment. The manufacturing method of the semiconductor device 300 will be described below with reference to FIGS. 12 to 15.

Figure 12:
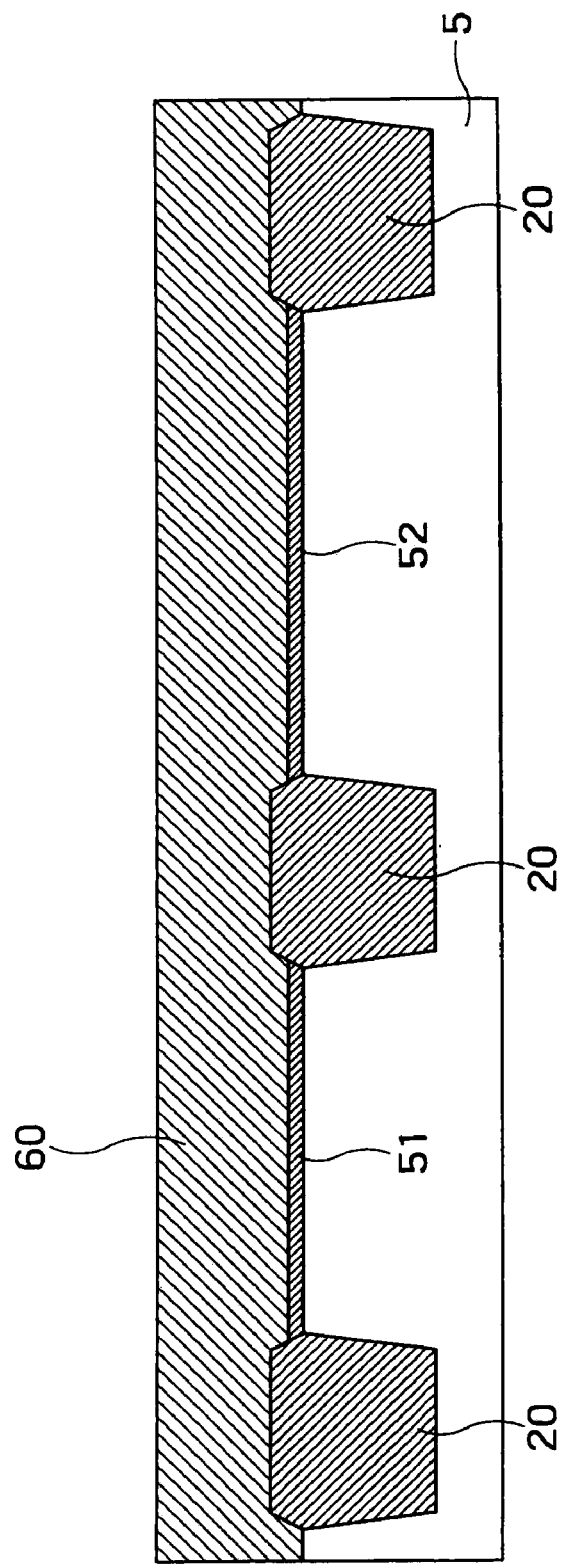
FIG. 12 is a sectional diagram showing a manufacturing method of the semiconductor device 300 according to the third embodiment.

As shown in FIG. 12, the STI 20 is formed in the same manner as that in the first embodiment. The silicon thermal oxide films 51 and 52 and the polysilicon film 60 are continuously formed. At this time, the thickness of the deposited polysilicon film is about 50 nm.

Figure 13:
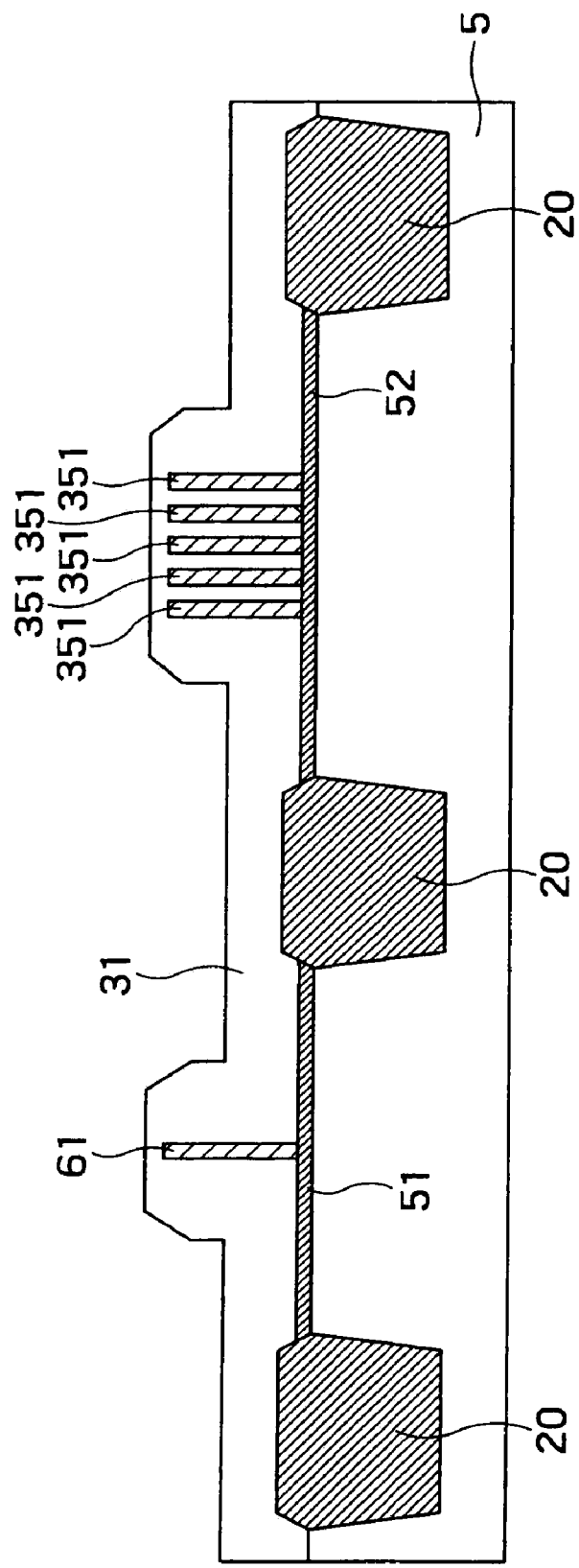
FIG. 13 is a sectional diagram following FIG. 12.

As shown in FIG. 13, the first gate electrode 61 and the sub-gate electrodes 351 are formed by using a photolithography technique and an RIE method. At this time, the first gate electrode 61 and the sub-gate electrodes 351 are micropatterned by using a slimming technique to their widths about 20 nm. An interval between the adjacent sub-gate electrodes 351 is 5 nm. In this manner, the lengths of the first gate electrode 61 and the sub-gate electrodes 351 in directions of channel lengths of these electrodes are made equal to each other, therefore, the first gate electrode 61 and the sub-gate electrodes 351 can be easily etched.

Figure 14:
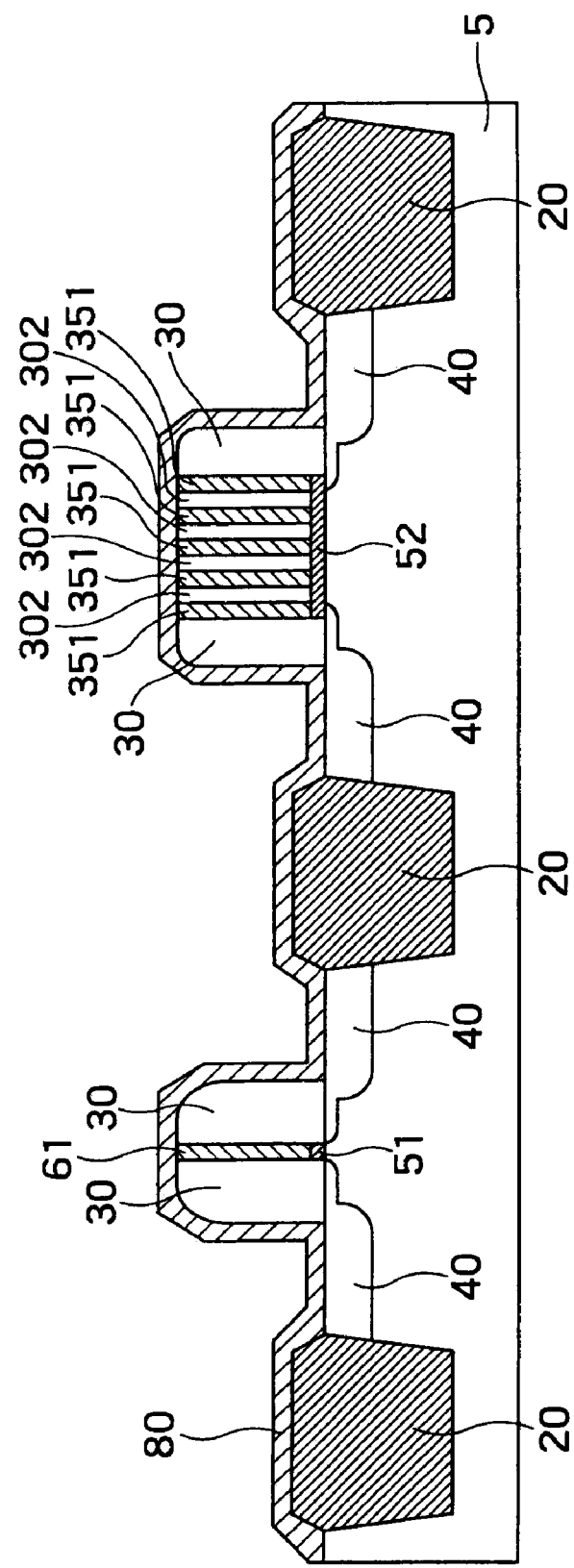
FIG. 14 is a sectional diagram following FIG. 13.

An insulating material 31 is deposited on the entire surface of the semiconductor substrate 5. The insulating material 31 is a silicon oxide film, for example. The insulating material 31 is etched by using the RIE method. At this time, as shown in FIG. 14, the side wall 30 is formed, and the inter-electrode insulation film 302 is formed between the sub-gate electrodes 351.

The source-drain layer 40 is formed in the same manner as in the first embodiment. As shown in FIG. 14, a nickel film 80 is deposited on the entire surface of the semiconductor substrate 5. The thickness of the nickel film 80 may be about 12 nm.

Figure 15:
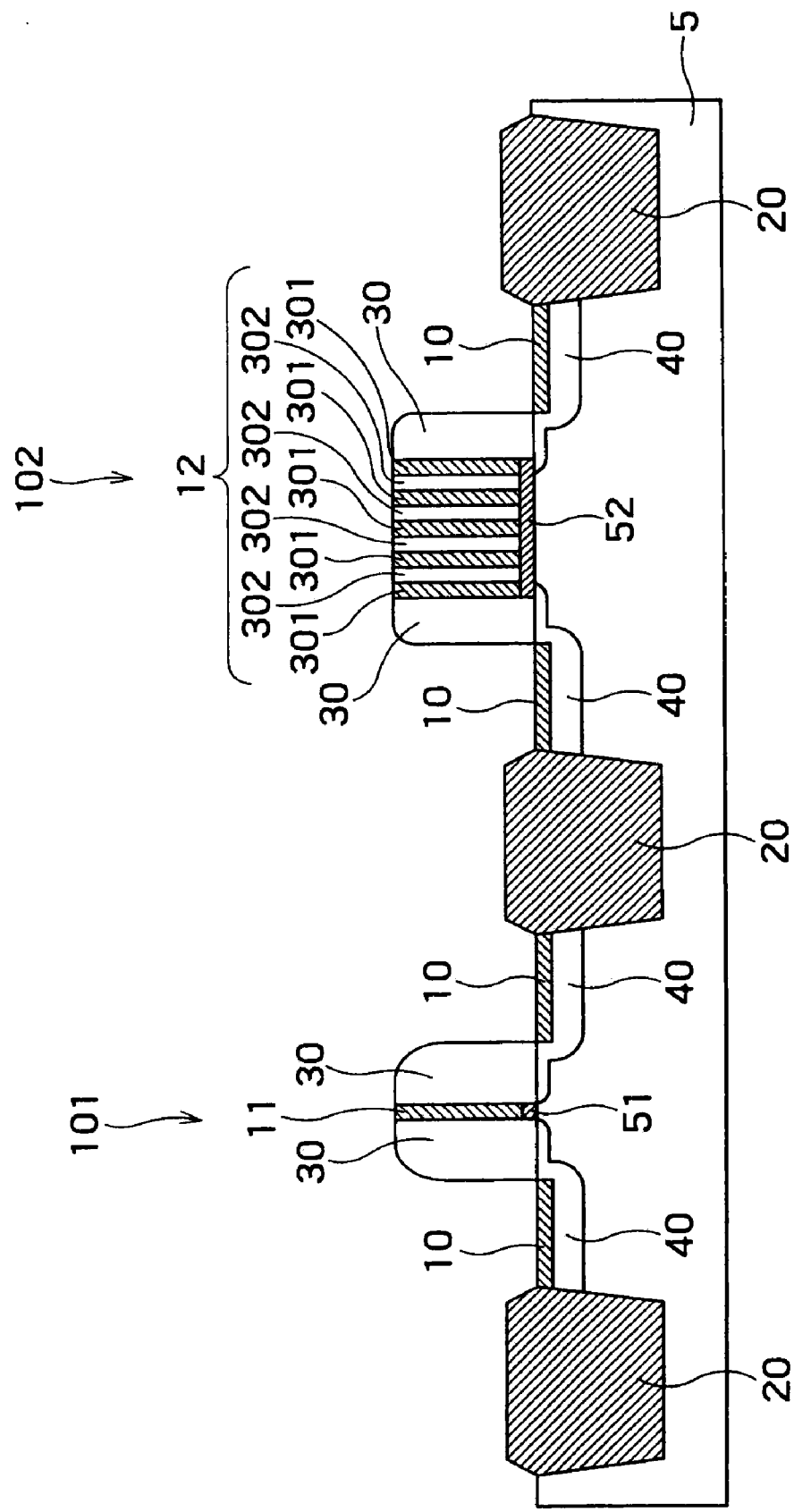
FIG. 15 is a sectional diagram following FIG. 14.

Subsequently, lamp annealing is executed 450° C. for 60 seconds. At this time, as shown in FIG. 15, the first gate electrode 61 and the plurality of sub-gate electrodes 351 are fully silicided by a reverse thin-line effect. In this manner, the first gate electrode 11 and the sub-gate electrodes 301 which are fully silicided can be obtained.

As described above, in the third embodiment, the first and second gate electrodes 11 and 12 are fully silicided by the reverse thin-line effect. In this manner, the thicknesses of the first and second gate electrodes 11 and 12 can be made equal to each other. As a result, the first and second gate electrodes 11 and 12 can be formed by using a common process.

The plurality of sub-gate electrodes 301 are electrically connected by pads or the like. Since an interval between the adjacent sub-gate electrodes 301 is very small, i.e., about 5 nm, a channel is not disconnected in an operation of the MIS transistor 102.

(Fourth Embodiment)

Figure 16:
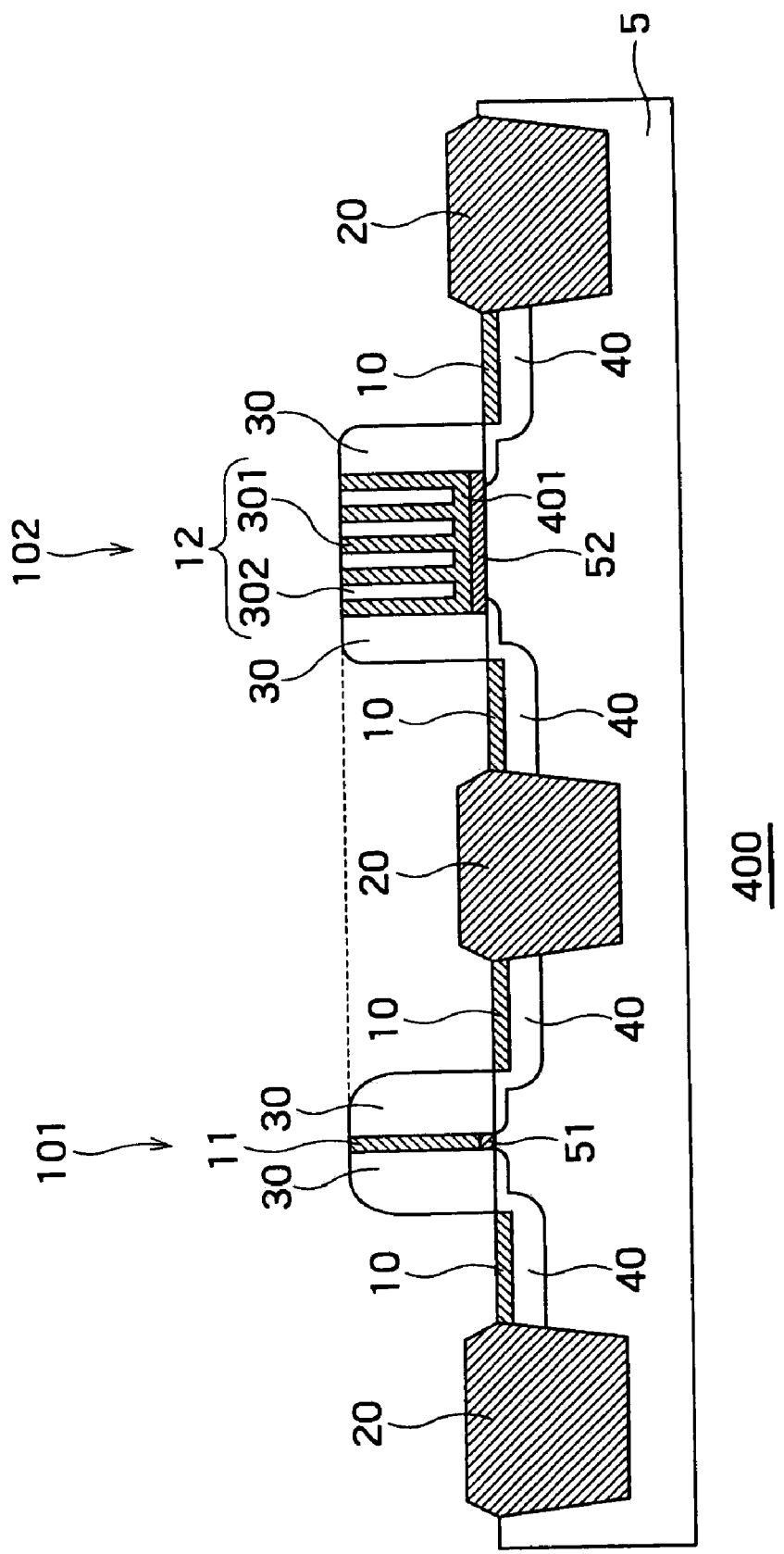
FIG. 16 is a sectional diagram of a semiconductor device 400 according to a fourth embodiment of the present invention.

FIG. 16 is a sectional diagram of a semiconductor device 400 according to a fourth embodiment of the present invention. In the fourth embodiment, a second gate electrode 12 has a silicide layer 401 on a gate insulation film between adjacent sub-gate electrodes 301. The silicide layer 401 consists of nickel silicide, for example. The thickness of the silicide layer 401 is 5 nm, for example. The other configuration in the fourth embodiment may be the same as that in the third embodiment.

In the fourth embodiment, the silicide layer 401 is uniformly formed near a second gate insulation film 52. In this manner, controllability of the work function of the second gate electrode 12 is improved. In addition, the fourth embodiment has the same effect as that of the third embodiment.

A first manufacturing method according to the fourth embodiment may be almost the same as the manufacturing method of the third embodiment. In FIGS. 12 and 13, when a polysilicon film 60 is etched, polysilicon is still remained between the sub-gate electrodes 351 when the first gate electrode 61 is formed. In the third embodiment, the polysilicon film 60 is further etched to remove polysilicon between the sub-gate electrodes 351. However, in the fourth embodiment, the etching is stopped while polysilicon is remained between the sub-gate electrodes 351. Furthermore, the left polysilicon is silicided simultaneously with the sub-gate electrodes 351 to make it possible to obtain a silicide layer 401.

FIGS. 17 to 20 are sectional flow diagrams showing a flow of a second manufacturing method of the semiconductor device 400. The second manufacturing method of the semiconductor device 400 will be described below with reference to FIGS. 17 to 20.

Figure 17:
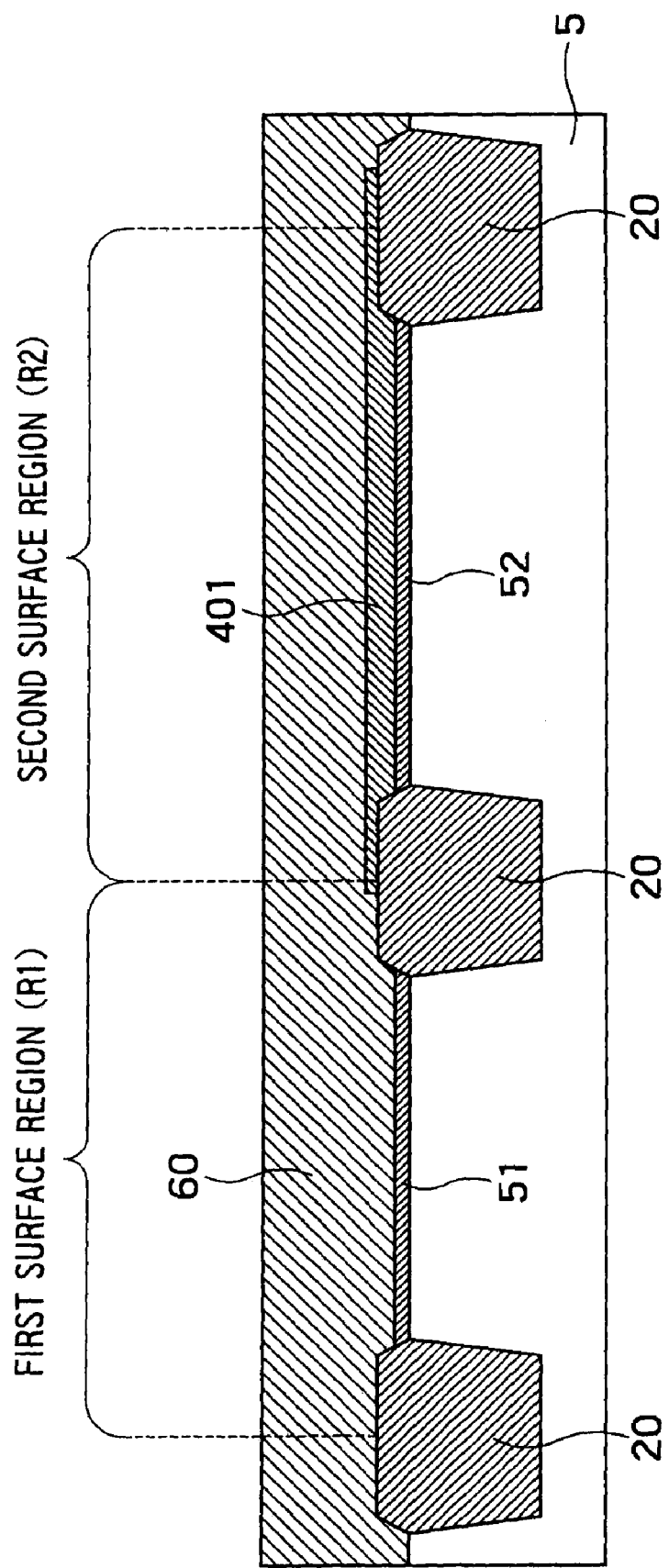
FIG. 17 is a sectional diagram showing a second manufacturing method of the semiconductor device 400.

As shown in FIG. 17, the STI 20 is formed as in the first embodiment. The silicon thermal oxide films 51 and 52 are formed. The first surface region is masked, and the second surface region is exposed by using a photolithography technique and an RIE method. Subsequently, the silicide layer 401 is deposited by CVD to have a thickness of about 5 nm. A polysilicon film 60 is deposited by the CVD. At this time, the thickness of the deposited polysilicon film is about 50 nm. Thereafter, the surface of the polysilicon film 60 may be planarized.

Figure 18:
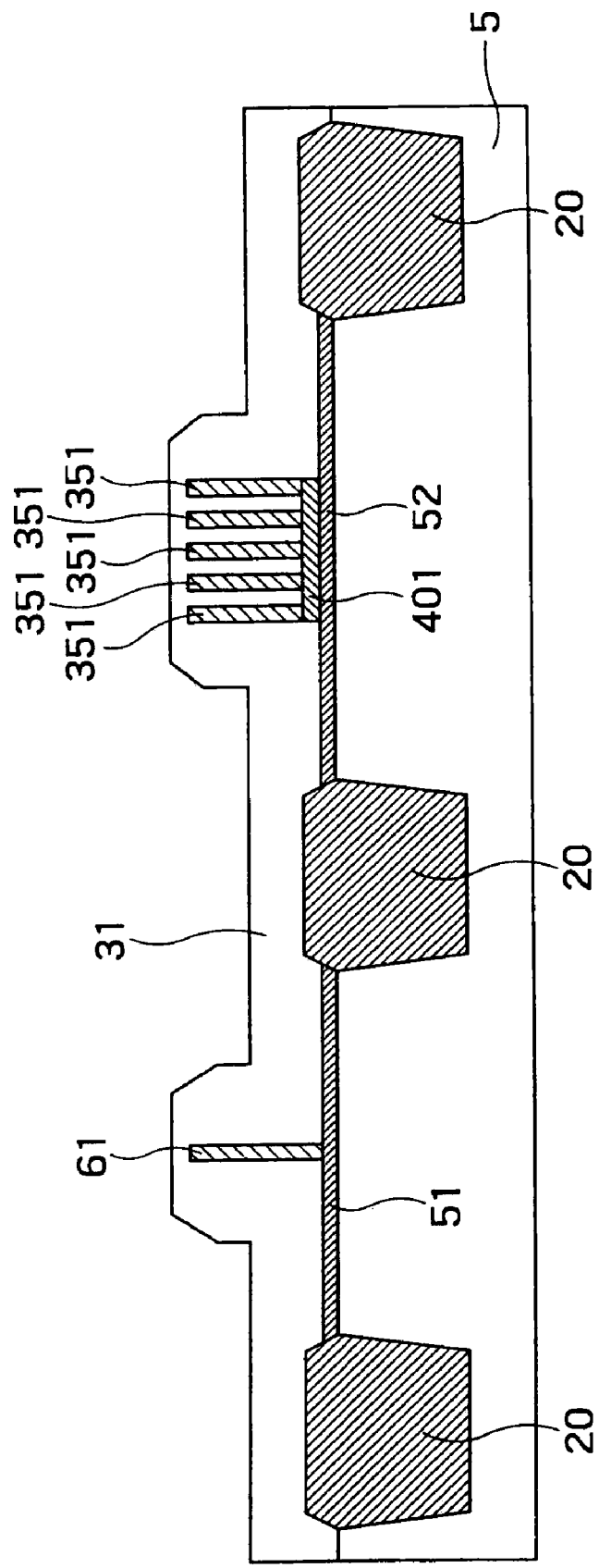
FIG. 18 is a sectional diagram following FIG. 17.

As shown in FIG. 18, the first gate electrode 61 and the sub-gate electrodes 351 are formed. At this time the first gate electrode 61 and the sub-gate electrodes 351 must be formed in different steps, respectively. This is because amounts of etching of the first gate electrode 61 and the sub-gate electrode 351 are different from each other, since the thickness of the first gate electrode 61 is different from the thickness of the sub-gate electrode 351.

For example, by using a photolithography technique, the second surface region R2 is masked, the first surface region R1 is exposed. RIE is executed by using the first gate insulation film 51 as an end point to etch the polysilicon film 60 in the first surface region R1. In this manner, the first gate electrode 61 is formed. The first surface region R1 is masked, and the second surface region R2 is exposed by using the photolithography technique. Then, RIE is executed by using the silicide layer 401 as an end point to etch the polysilicon film 60 in the second surface region R2. Therefore, the sub-gate electrodes 351 are formed.

Figure 19:
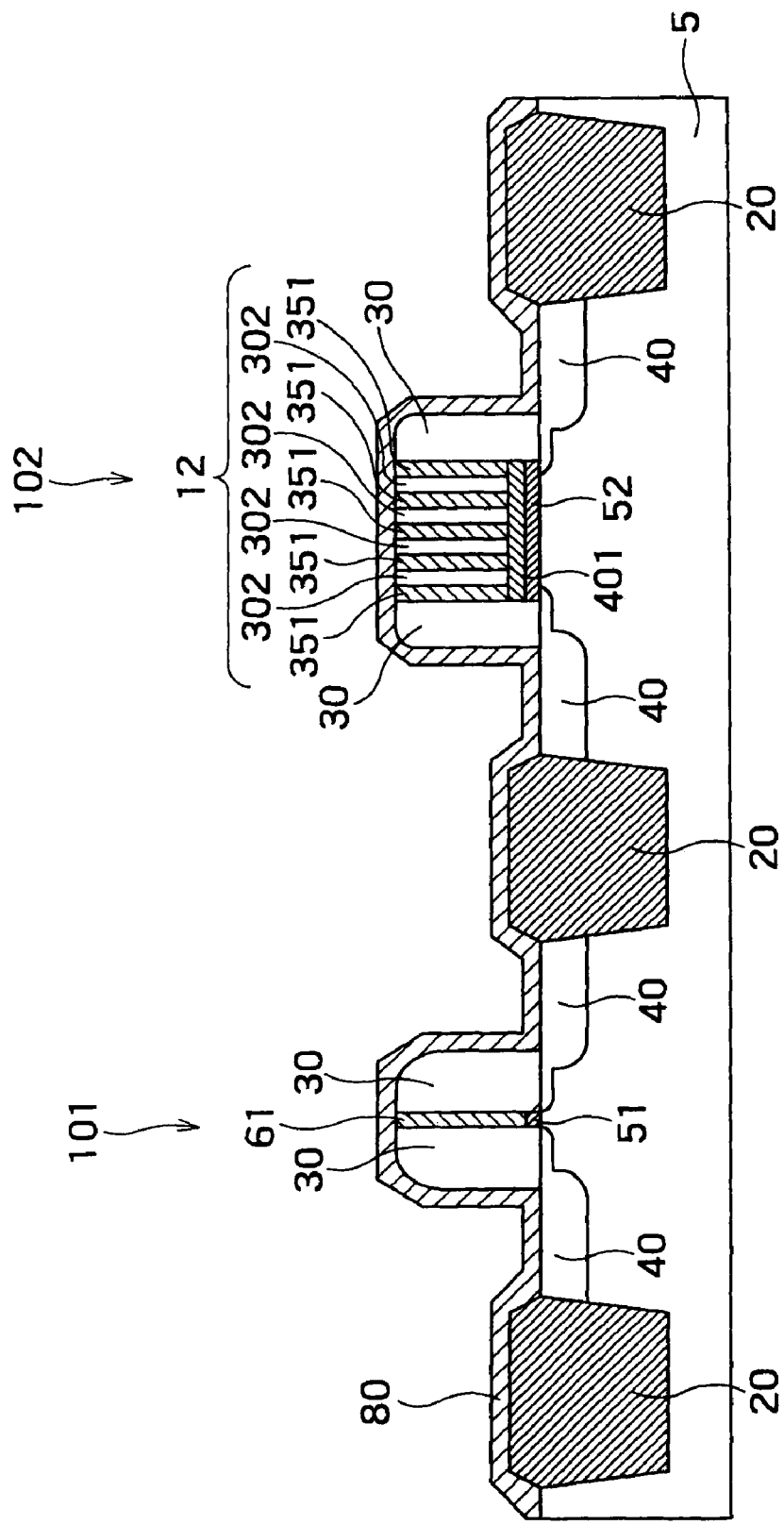
FIG. 19 is a sectional diagram following FIG. 18.

The insulating material 31 is deposited on the entire surface of the semiconductor substrate 5. The insulating material 31 is a silicon oxide film, for example. The insulating material 31 is etched by using the RIE method. At this time, as shown in FIG. 19, the side wall 30 is formed, and the inter-electrode insulation film 302 is formed between the sub-gate electrodes 351.

The source-drain layer 40 is formed as in the first embodiment. Furthermore, the nickel film 80 is deposited on the entire surface of the semiconductor substrate 5. The thickness of the nickel film 80 may be about 12 nm.

Figure 20:
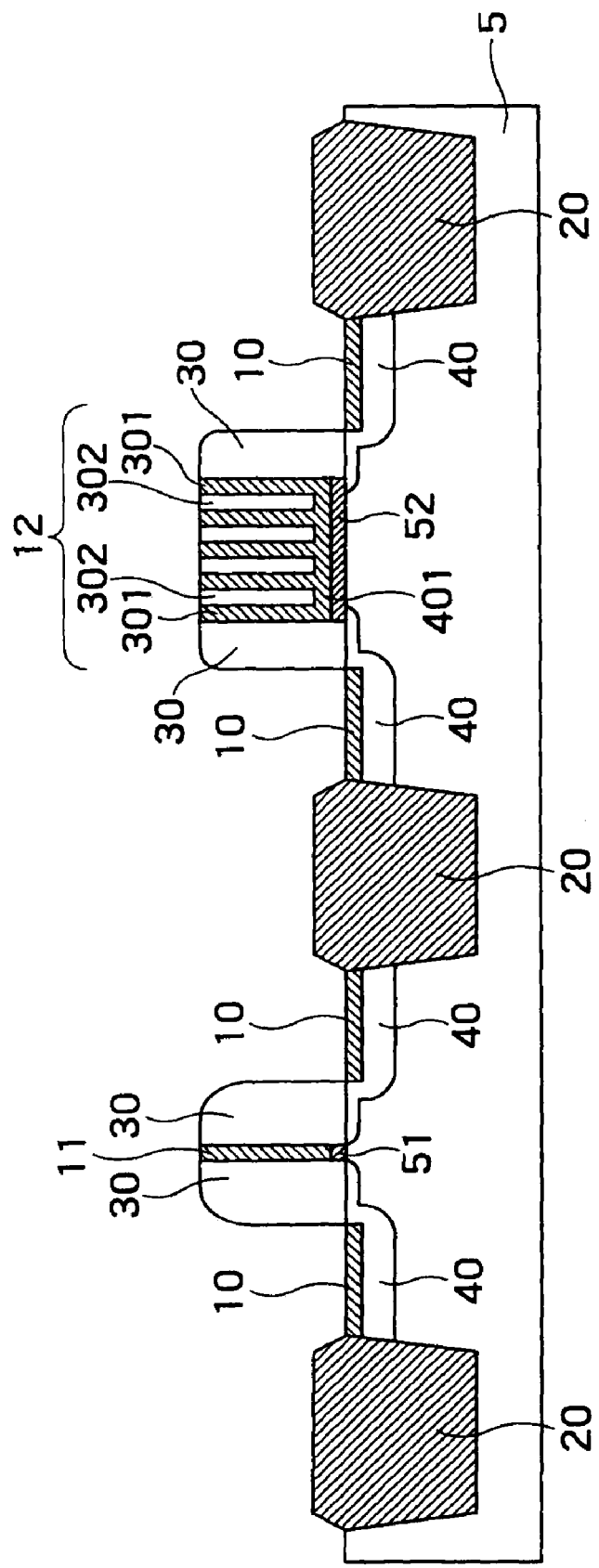
FIG. 20 is a sectional diagram following FIG. 19.

Subsequently, a lamp annealing is executed at 450° C. for 60 seconds. At this time, as shown in FIG. 20, the first gate electrode 61 and the plurality of sub-gate electrodes 351 are fully silicided by a reverse thin-line effect. In this manner, the first gate electrode 11 and the sub-gate electrodes 301 which are fully silicided can be obtained.

In this manner, in the third embodiment, both the first and second gate electrodes 11 and 12 are fully silicided by the reverse thin-line effect. Furthermore, the plurality of sub-gate electrodes 301 are electrically connected by the silicide layer 401.

According to the second manufacturing method, the plurality of sub-gate electrodes 301 in the second gate electrode 12 can be reliably electrically connected on the second gate insulation film 52. In this manner, controllability of the work function of the second gate electrode 12 is improved.

(Fifth Embodiment)

Figure 21:
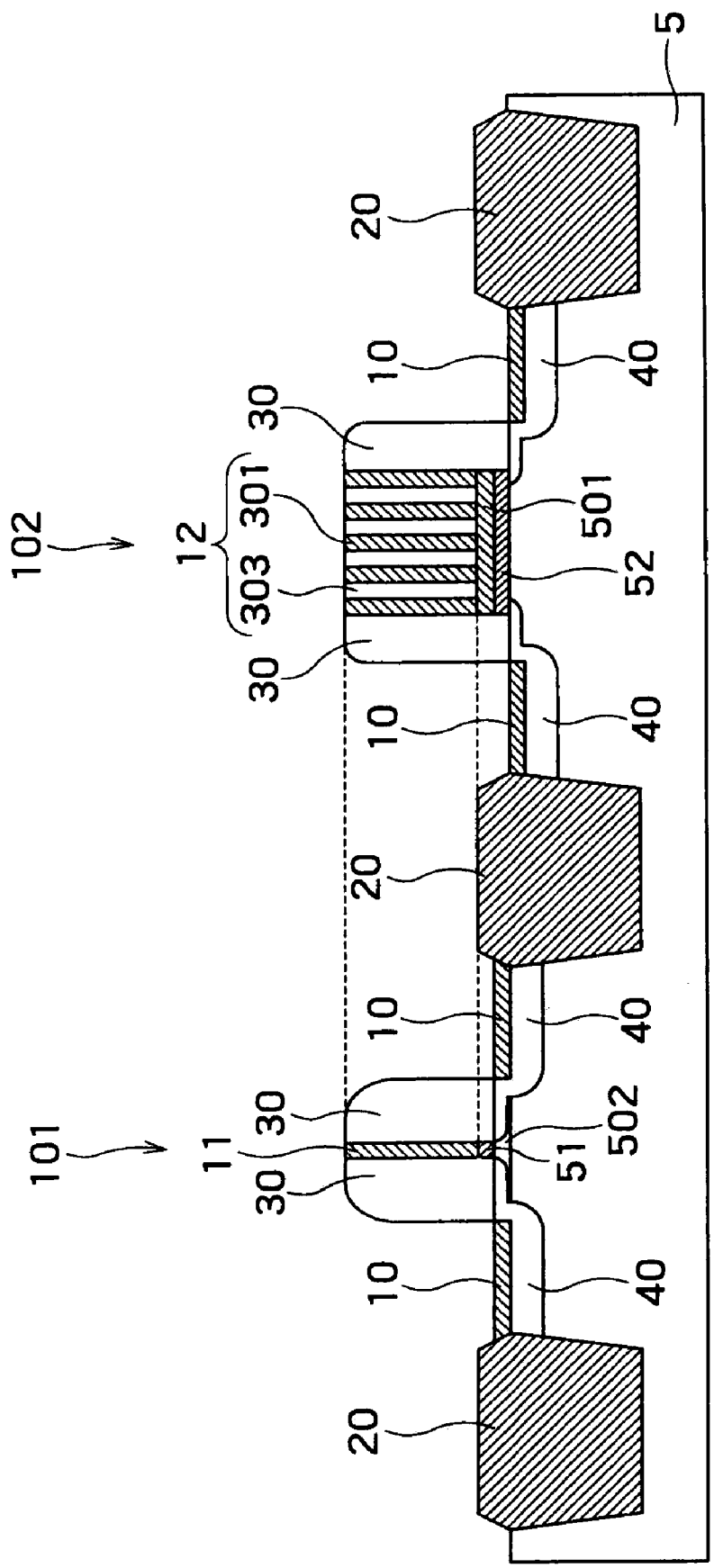
FIG. 21 is a sectional diagram of a semiconductor device 500 according to a fifth embodiment of the present invention.

FIG. 21 is a sectional diagram of a semiconductor device 500 according to a fifth embodiment of the present invention. In the fifth embodiment, a second gate electrode 12 has a two-layer structure, the position of the bottom surface of a first gate electrode 11 is raised by a semiconductor region 502.

In a bottom portion of the second gate electrode 12, a silicide layer 501 is formed on a second gate insulation film 52. Sub-gate electrodes 301 and inter-electrode insulation films 302 are formed on the upper portion of the second gate electrode 12. Since the sub-gate electrodes 301 is formed on the silicide layer 501, in order to make the levels of the upper surfaces of the sub-gate electrodes 301 and the first gate electrode 11 equal to each other, the semiconductor region 502 is formed on the semiconductor substrate 5 in a first surface region R1.

The thickness of the semiconductor region 502 is almost equal to the thickness of the silicide layer 501. For this reason, the thickness of the first gate electrode 11 can be made equal to the thickness of the sub-gate electrode 301. As a result, the first gate electrode 11 and the sub-gate electrodes 301 can be simultaneously formed in the same process.

The other configuration in the fifth embodiment may be the same as that in the fourth embodiment. The fifth embodiment has the same effect as that in the fourth embodiment.

FIGS. 22 to 25 are sectional flow diagrams showing a flow of a manufacturing method of the semiconductor device 500. The manufacturing method of the semiconductor device 500 will be described below with reference to FIGS. 22 to 25.

Figure 22:
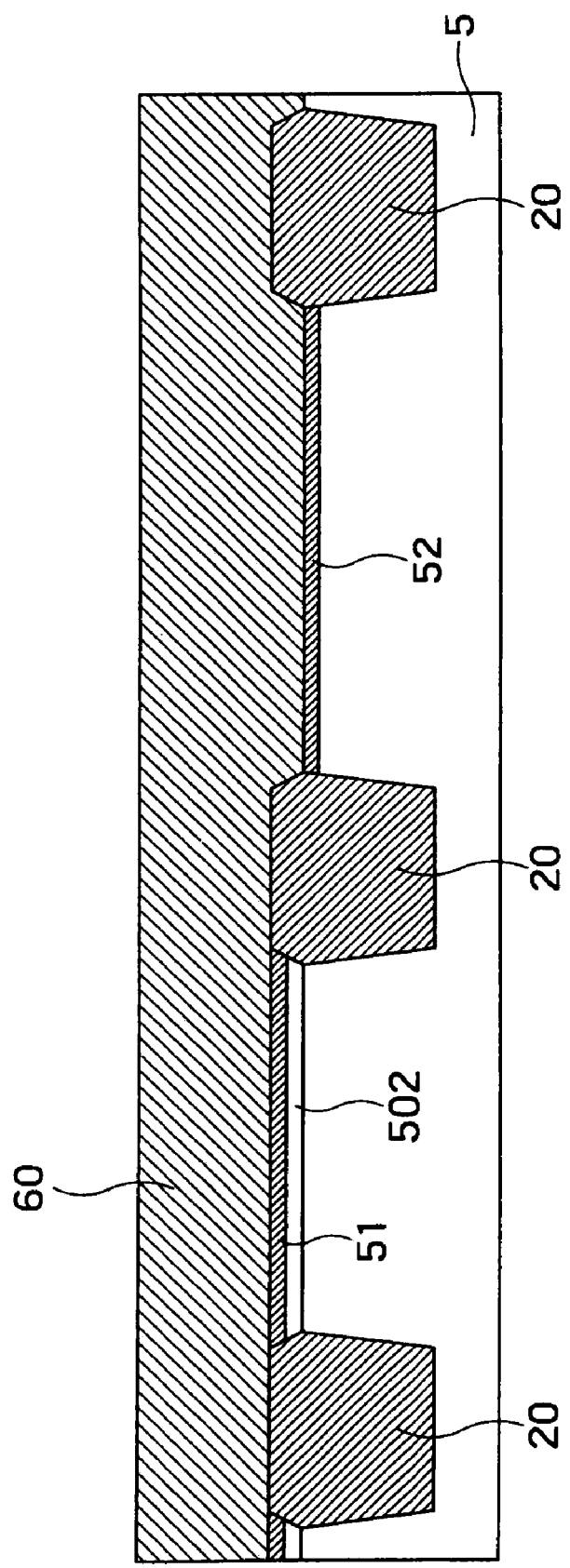
FIG. 22 is a sectional diagram showing a manufacturing method of the semiconductor device 500.

As shown in FIG. 22, by using a photolithography technique and an RIE method, the first surface region is masked, and a second surface region is exposed. Subsequently, the silicide layer 401 is deposited by CVD to have a thickness of about 5 nm. The STI 20 is formed in the same manner as that in the first embodiment. The silicon thermal oxide films 51 and 52 and the polysilicon film 60 are continuously formed. If the surface of the polysilicon film 60 is not flat, the surface of the polysilicon film 60 is planarized by CMP.

Figure 23:
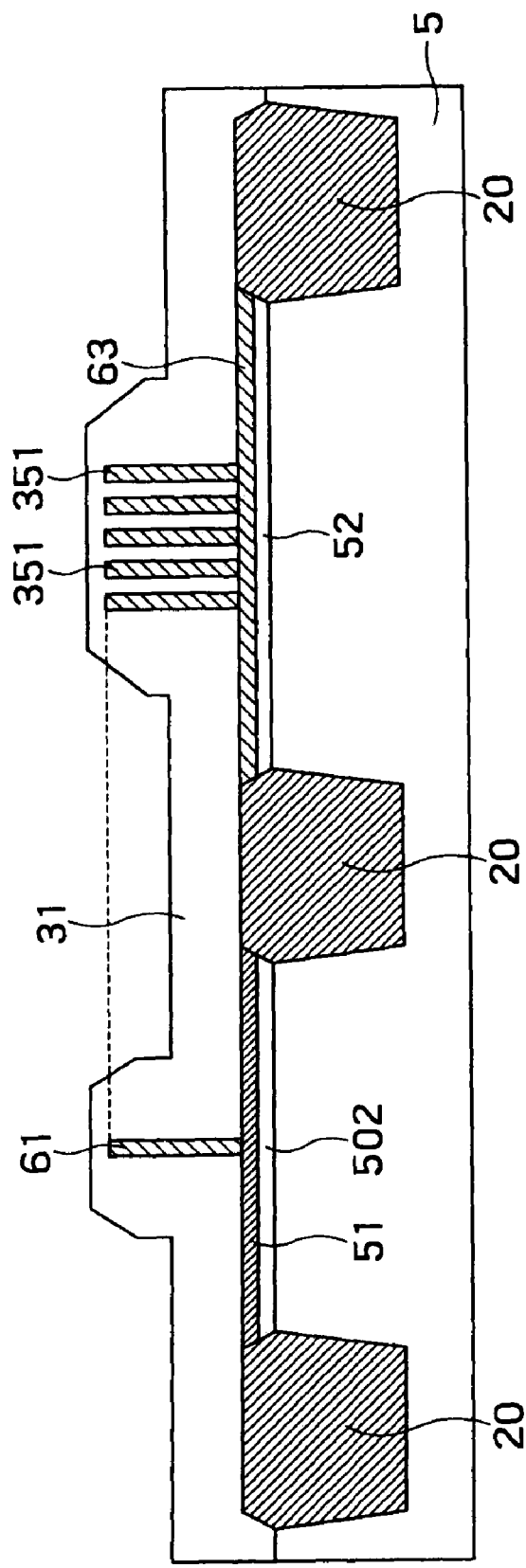
FIG. 23 is a sectional diagram following FIG. 22.

As shown in FIG. 23, by using a photolithography technique and an RIE method, the first gate electrode 61 and the sub-gate electrodes 351 are formed. At this time, when the first gate insulation film 51 is exposed, and when polysilicon is remained on the second gate insulation film 52, the etching is stopped. In this manner, a polysilicon layer 63 can be remain on the second gate insulation film 52. According to the method of the embodiment, the first gate electrode 61 and the sub-gate electrodes 351 having equal levels from the surface of the semiconductor substrate 5 can be simultaneously formed.

Figure 24:
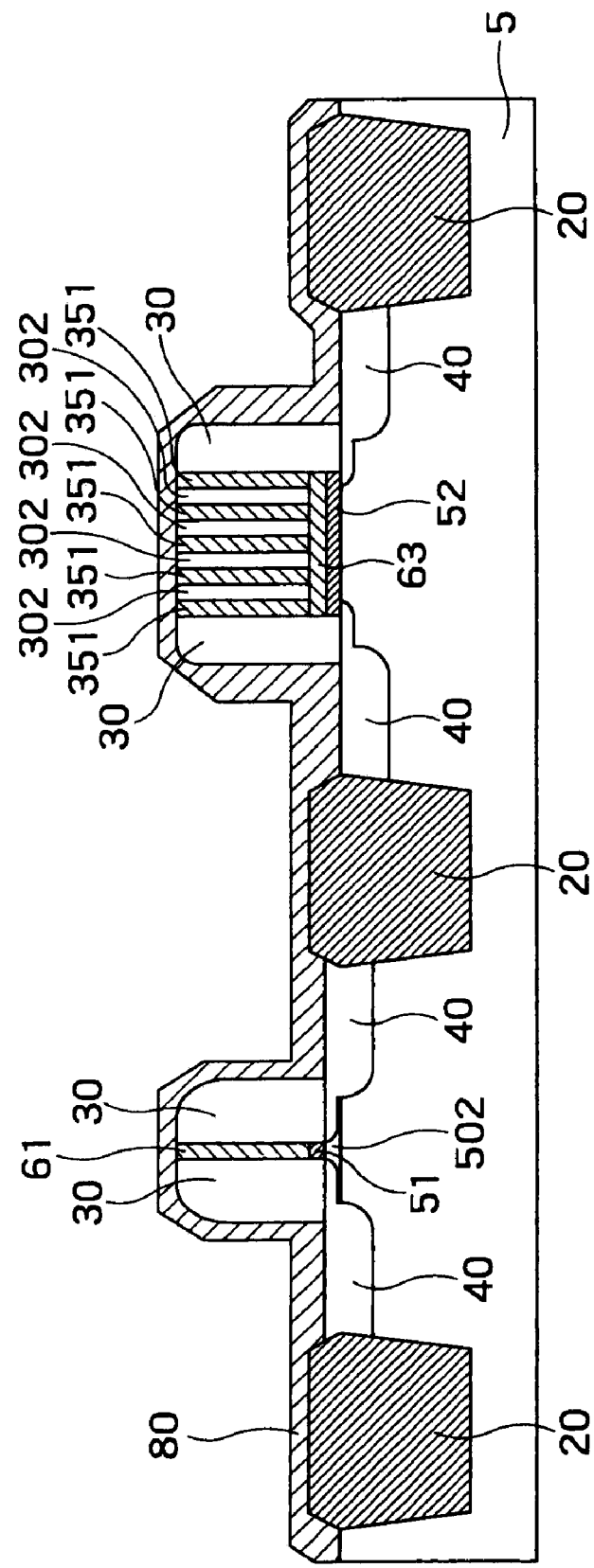
FIG. 24 is a sectional diagram following FIG. 23.

The insulating material 31 is deposited on the entire surface of the semiconductor substrate 5. The insulating material 31 is a silicon oxide film, for example. The insulating material 31 is etched by using an RIE method. At this time, as shown in FIG. 24, the side wall 30 is formed, and the inter-electrode insulation film 302 are formed between the sub-gate electrodes 351.

The source-drain layer 40 is formed in the same manner as in the first embodiment. Furthermore, the nickel film 80 is deposited on the entire surface of the semiconductor substrate 5.

Figure 25:
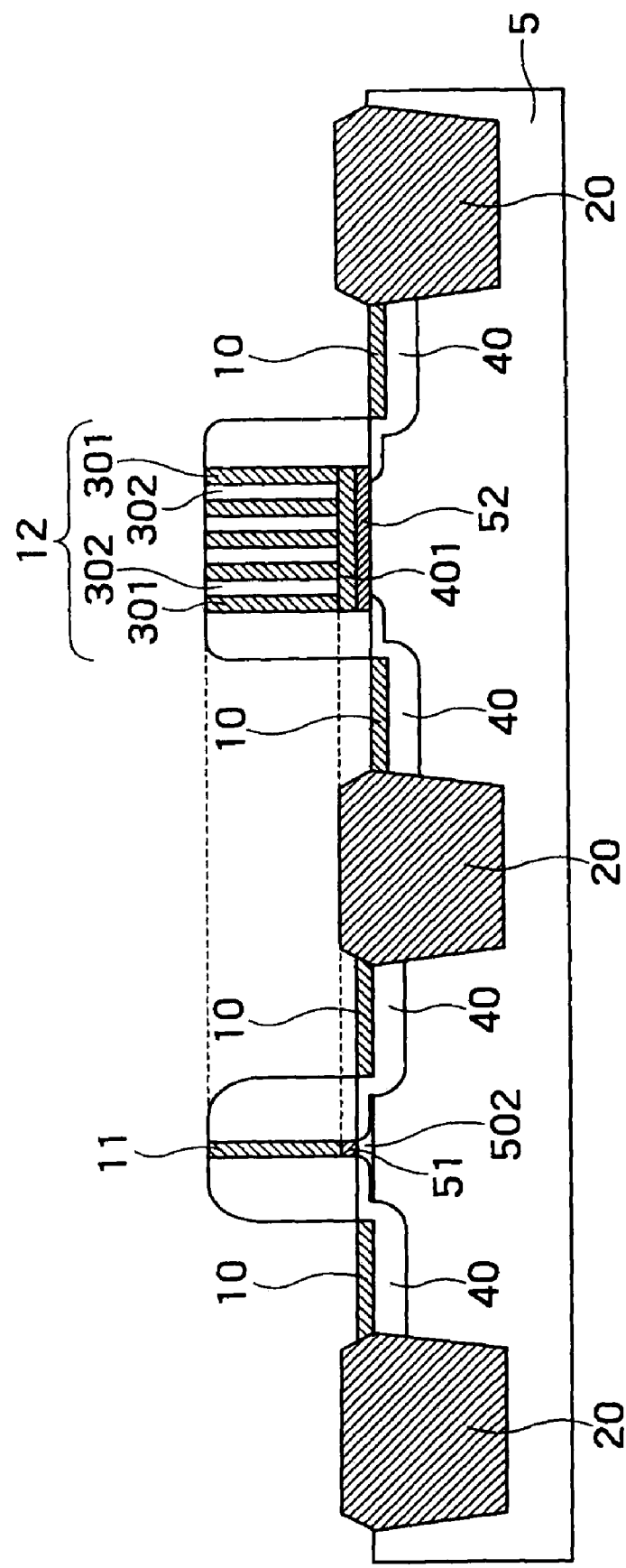
FIG. 25 is a sectional diagram following FIG. 24.

Subsequently, a lamp annealing is executed at 450° C. for 60 seconds. At this time, as shown in FIG. 25, the first gate electrode 61, the plurality of sub-gate electrodes 351, and the polysilicon layer 63 are fully silicided by a reverse thin-line effect. In this manner, a first gate electrode 11, sub-gate electrodes 301, and a silicide layer 401 which are fully silicided can be obtained.

In the fifth embodiment, the first gate electrode 61 and the sub-gate electrodes 351 can be simultaneously formed, and the plurality of sub-gate electrodes 301 in the second gate electrode 12 can be reliably electrically connected on the second gate insulation film 52. In this manner, the controllability of the work function of the second gate electrode 12 is improved.

(Sixth Embodiment)

Figure 26:
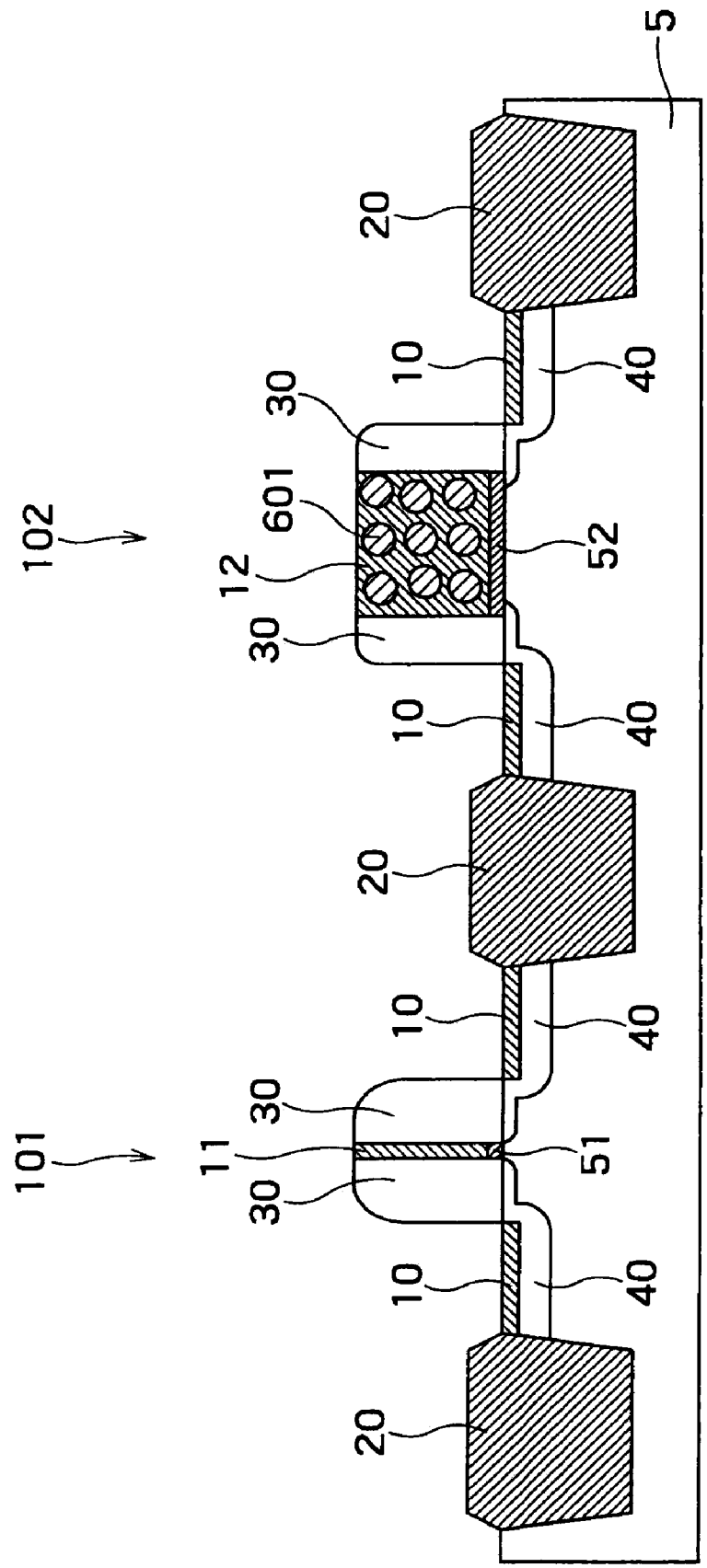
FIG. 26 is a sectional diagram of a semiconductor device 600 according to a sixth embodiment of the present invention.

FIG. 26 is a sectional diagram of a semiconductor device 600 according to a sixth embodiment of the present invention. In the sixth embodiment, insulating particles 601 are arranged in a second gate electrode 12. The thickness (height) of the second gate electrode 12 may be equal to that of a first gate electrode 11. For example, the thicknesses of the first and second gate electrodes 11 and 12 are 50 nm each. The other configuration in the sixth embodiment may be the same as that in the first embodiment.

If the gate length of the second gate electrode 12 is 100 nm, and when the thickness of the second gate electrode 12 is 50 nm, the diameters of the insulating particles 601 are 5 nm to 10 nm. The insulating particles 601 consist of a silicon oxide, for example.

The insulating particles 601 are arranged in the second gate electrode 12 to decrease the substantial volume of the second gate electrode 12. Therefore, a reverse thin-line effect is accelerated in the second gate electrode 12. As a result, the first and second gate electrodes 11 and 12 can be simultaneously fully silicided. Furthermore, the thickness of the second gate electrode 12 is equal to the thickness of the first gate electrode 11 and relatively large, so that resistance against to a short-circuit phenomenon between the gate and the source/drain can be higher.

FIGS. 27 to 30 are sectional flow diagrams showing a flow of a manufacturing method of the semiconductor device 600. The manufacturing method of the semiconductor device 600 will be described below with reference to FIGS. 27 to 30.

Figure 27:
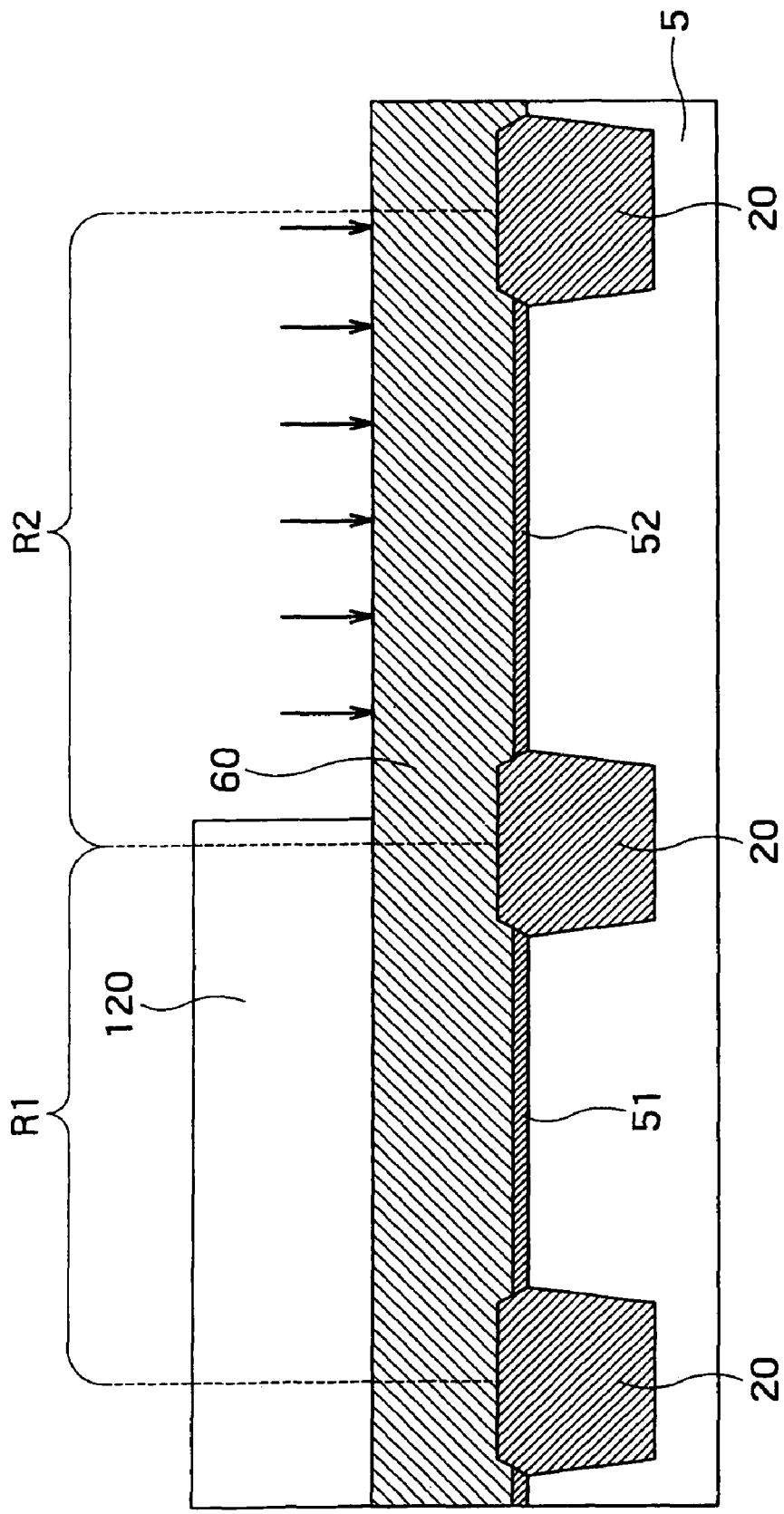
FIG. 27 is a sectional diagram showing a manufacturing method of the semiconductor device 600.

As shown in FIG. 27, the STI 20 is formed as in the first embodiment. The silicon thermal oxide films 51 and 52 and the polysilicon film 60 are continuously formed. Subsequently, the first surface region R1 is covered with a photoresist 120 by using a photolithography technique to expose only the second surface region R2. Oxygen is ion-implanted into the polysilicon film 60 in the second surface region R2. At this time, implantation energy of oxygen must be relatively lowered to prevent the second gate insulation film 52 from being damaged. An acceleration voltage of the oxygen ions is controlled to uniformly implant the oxygen ions into the second gate insulation film 52. Heat treatment is performed at about 1000° C. to uniformly form the insulating particles 601 in the polysilicon film 60 of the second surface region R2.

Figure 28:
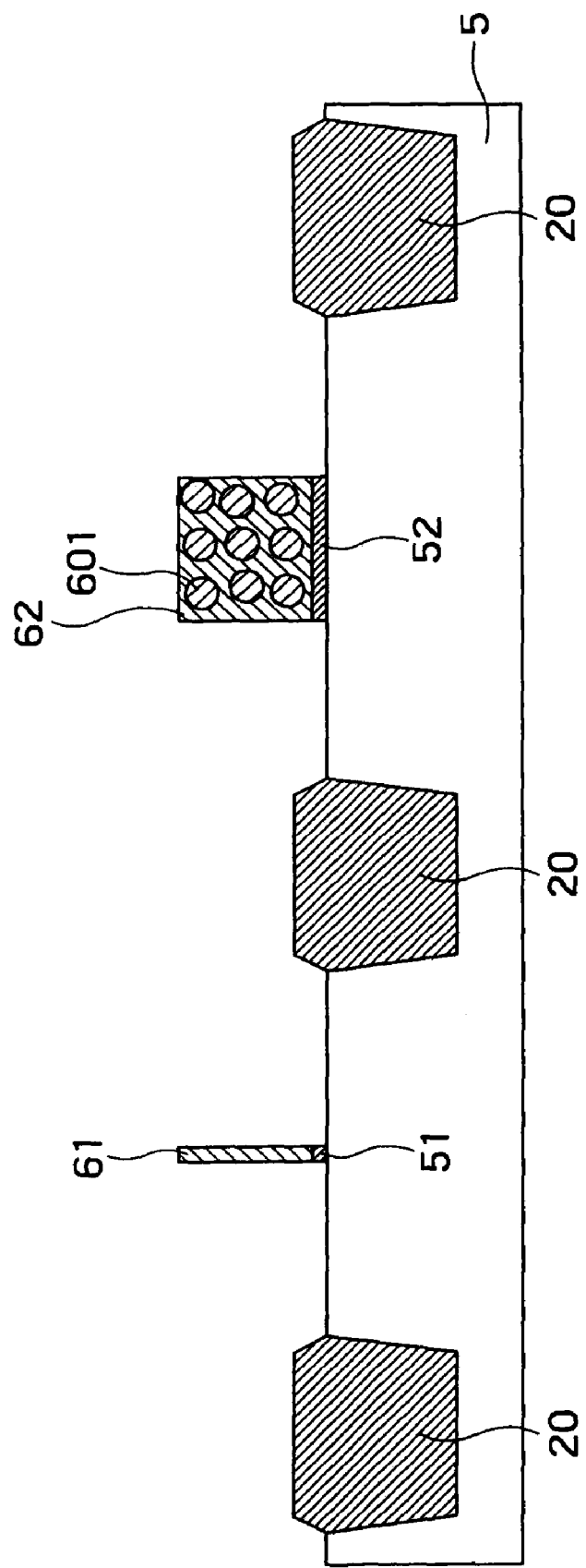
FIG. 28 is a sectional diagram following FIG. 27.

After the photoresist 120 is removed, the polysilicon film 60 is etched by using an RIE method. In this manner, as shown in FIG. 28, the first gate electrode 61 and the second gate electrode 62 are simultaneously formed.

Figure 29:
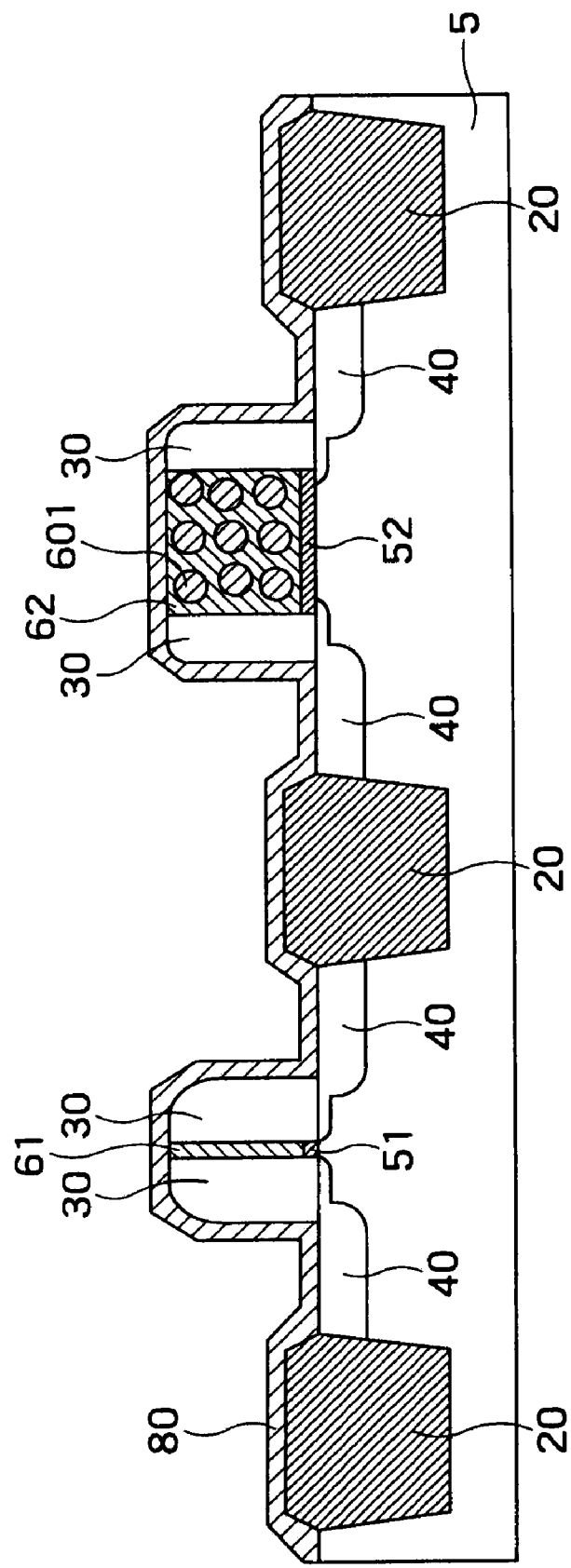
FIG. 29 is a sectional diagram following FIG. 28.
Figure 30:
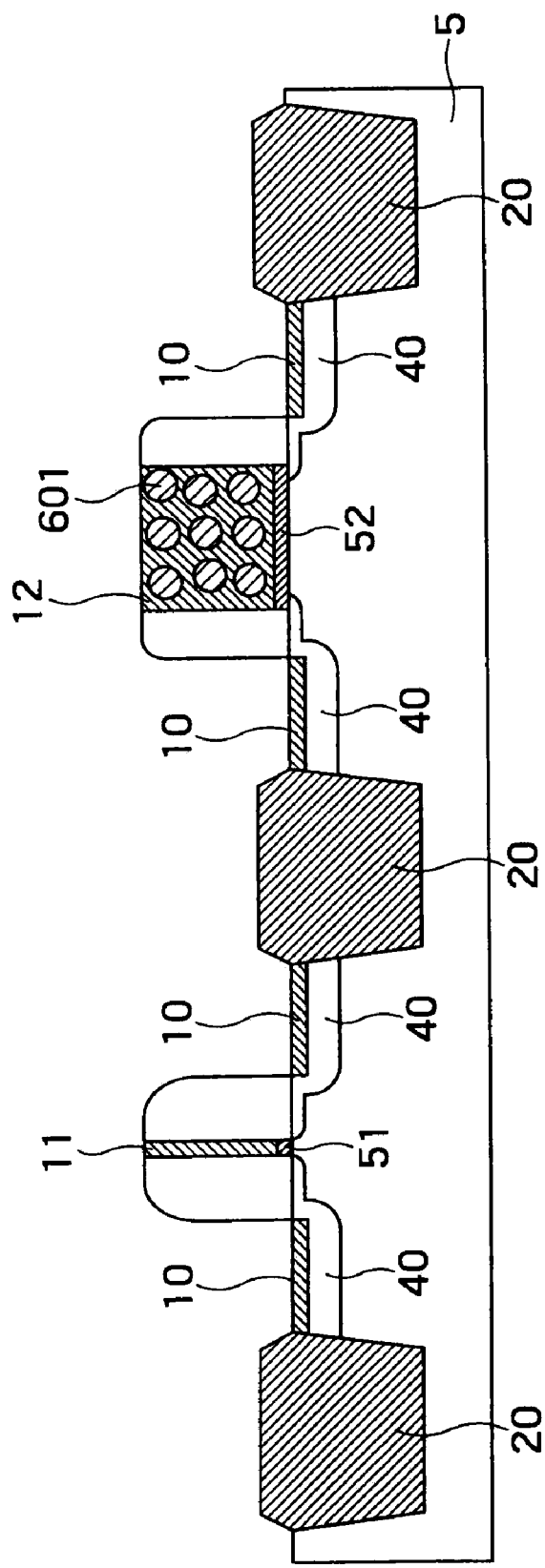
FIG. 30 is a sectional diagram following FIG. 29.

As shown in FIG. 29, the side wall 30 and the source-drain layer 40 are formed in the same manner as in the first embodiment. Furthermore, the nickel film 80 is deposited on the entire surface of the semiconductor substrate 5. The thickness of the nickel film 80 is about 12 nm. Subsequently, a lamp annealing is executed a 450° C. for 60 seconds. Since the second gate electrode 62 includes the insulating particles 601, the substantial volume of the second gate electrode 62 decreases. In this manner, as shown in FIG. 30, not only the first gate electrode 61, but also the second gate electrode 62 are similarly fully silicided by the reverse thin-line effect. As a result, the first and second gate electrodes 11 and 12 which are fully silicided can be obtained.

(Seventh Embodiment)

Figure 31:
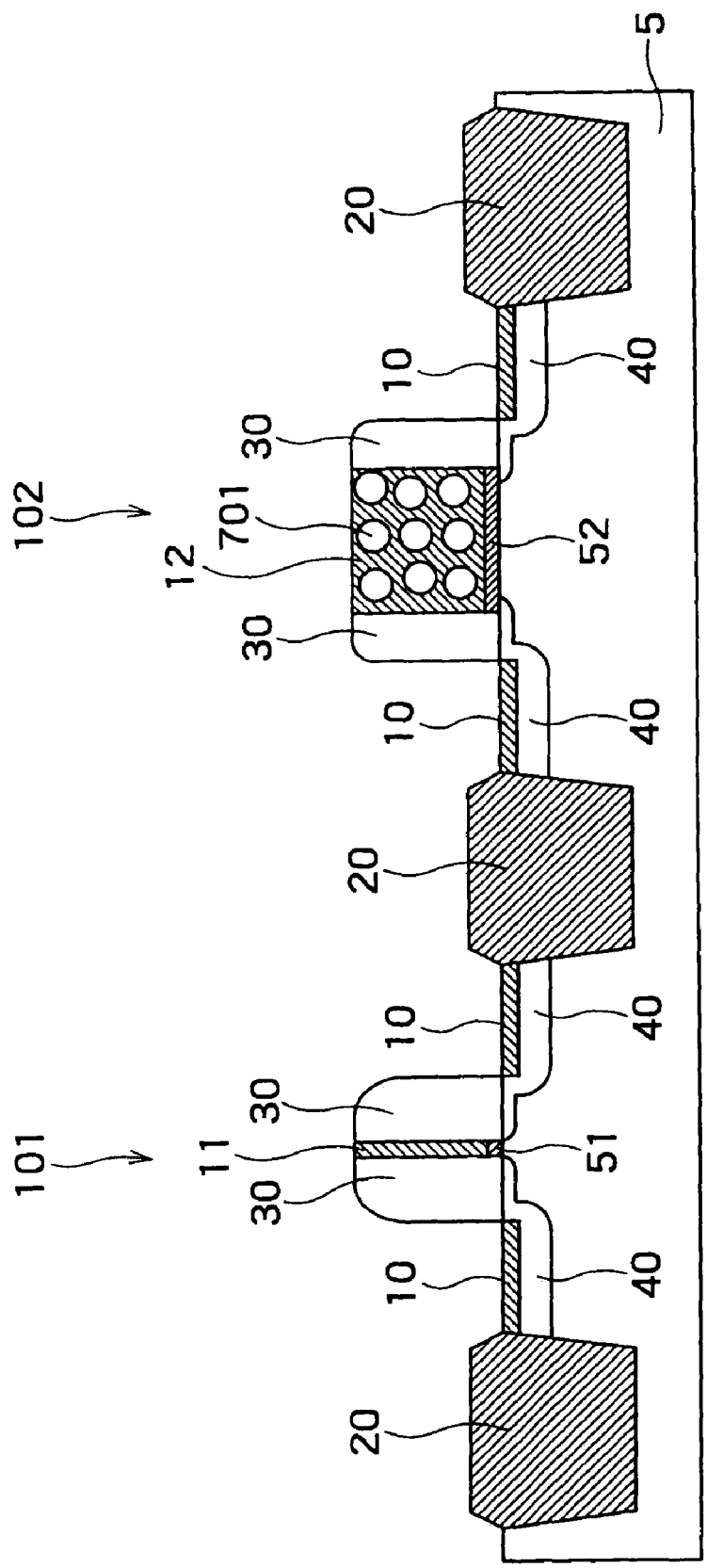
FIG. 31 is a sectional diagram of a semiconductor device 700 according to a seventh embodiment of the present invention.

FIG. 31 is a sectional diagram of a semiconductor device 700 according to a seventh embodiment of the present invention. The seventh embodiment is different from the second embodiment in that in place of the insulating particles 601, cavities 701 are formed in the second gate electrode 12. The other configuration of the seventh embodiment is the same as that in the sixth embodiment.

The density of the second gate electrode 12 is almost a half the density of the first gate electrode 11 because the second gate electrode 12 includes the cavities 701. The density of the first gate electrode 11 is equal to that of a bulk of nickel silicide, for example, $4.55 \times 10^{20}$ cm$^{-3}$.

Figure 32:
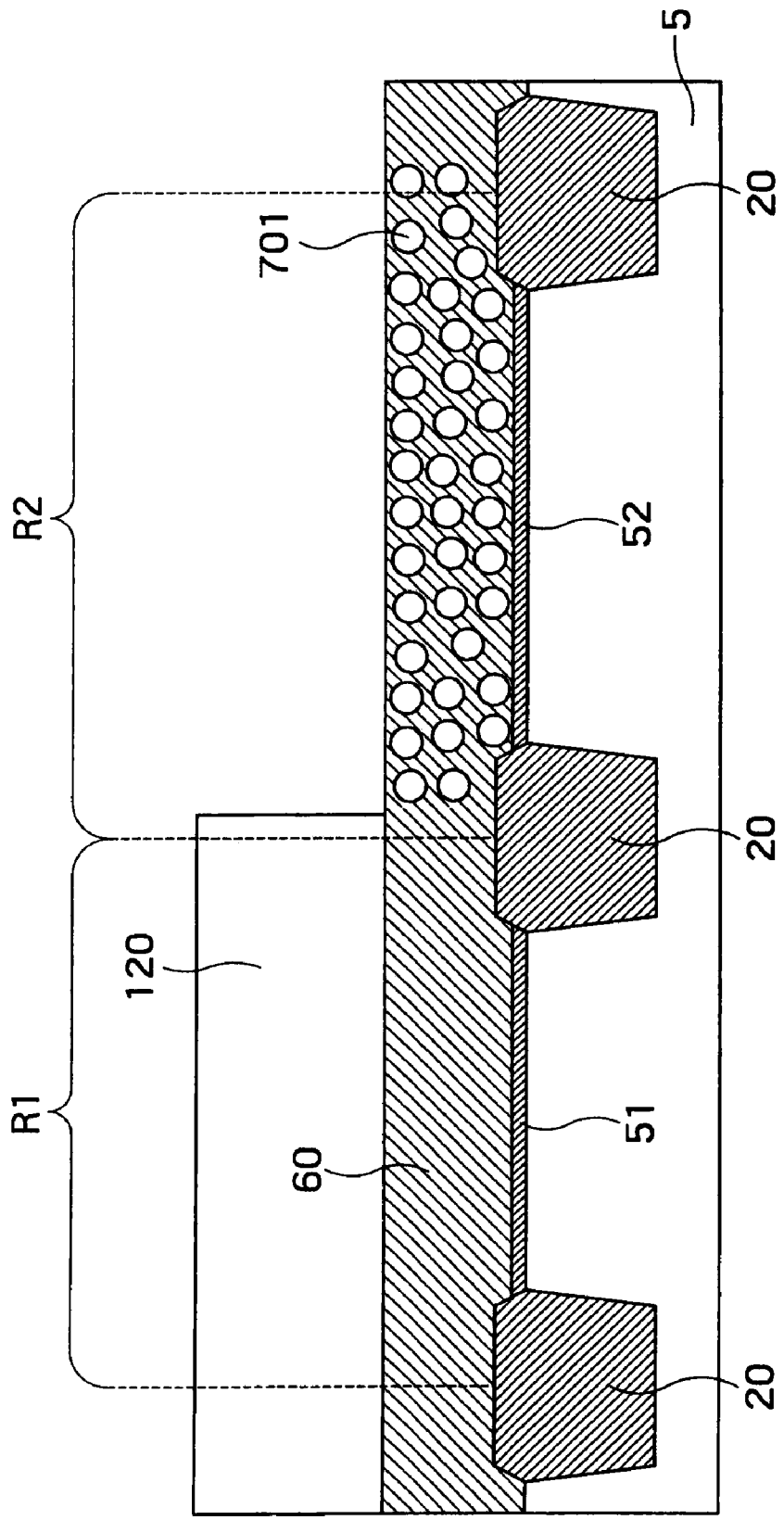
FIG. 32 is a sectional flow diagram showing a manufacturing method of the semiconductor device 700.
Figure 33:
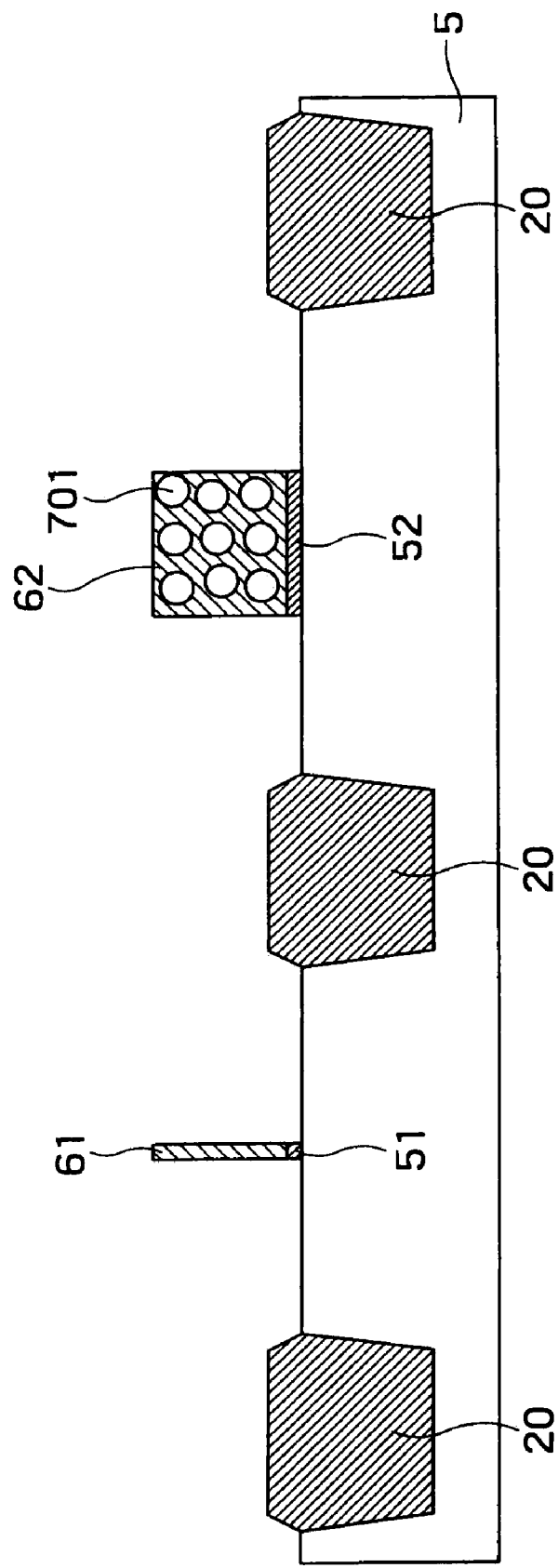
FIG. 33 is a sectional diagram following FIG. 32.

FIGS. 32 and 33 are sectional flow diagrams showing a flow of a manufacturing method of the semiconductor device 700. The manufacturing method of the semiconductor device 700 will be described below with reference to FIGS. 32 and 33.

As shown in FIG. 32, the STI 20 is formed as in the first embodiment. The silicon thermal oxide films 51 and 52 and the polysilicon film 60 are continuously formed. Subsequently, the first surface region R1 is covered with a photoresist 120 by a photolithography technique to expose only the second surface region R2. A porous siliconizing process is performed to the polysilicon film 60. For example, the polysilicon film 60 is dipped in a liquid mixture of hydrogen fluoride and hydrogen peroxide. In this manner, the polysilicon film 60 is etched in grain boundaries to form cavities 702 in the polysilicon film 60. That is, the polysilicon film 60 in the second surface region R2 is made porous. The density of the polysilicon film 60 in the second surface region R2 is made almost half the density of the polysilicon film 60 in the first surface region R1.

After the photoresist 120 is removed, the polysilicon film 60 is etched by using an RIE method. In this manner, as shown in FIG. 33, the first gate electrode 61 and the second gate electrode 62 are simultaneously formed.

Thereafter, as in the sixth embodiment, the side wall 30 and the source-drain layer 40 are formed. Furthermore, the nickel film 80 is deposited on the entire surface of the semiconductor substrate 5 to execute a lamp annealing. Since the second gate electrode 62 includes the cavities 701, the substantial volume of the second gate electrode 62 decreases. Therefore, not only the first gate electrode 61, but also the second gate electrode 62 are simultaneously fully silicided by a reverse thin-line effect. As a result, as shown in FIG. 31, the first and second gate electrodes 11 and 12 which are fully silicided can be obtained.

In general, when polysilicon is silicided, the polysilicon expands. Therefore, the cavities 701 in the second gate electrode 12 after silicided are smaller than the cavities 701 in the second gate electrode 62 which is not silicided. The seventh embodiment has the same effect as that in the sixth embodiment.

(Eighth Embodiment)

Figure 34:
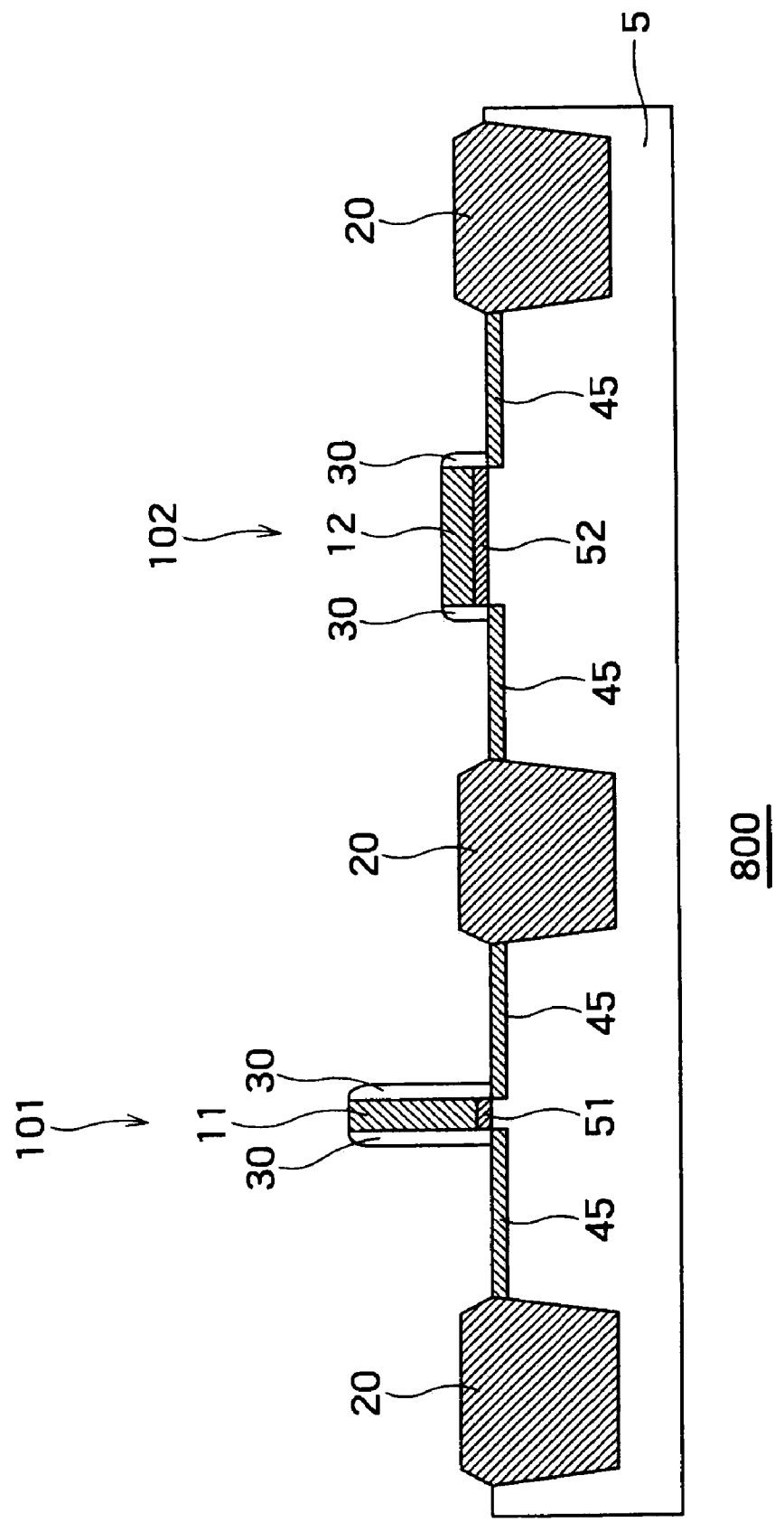
FIG. 34 is a sectional diagram of a semiconductor device 800 according to an eighth embodiment of the present invention.

FIG. 34 is a sectional diagram of a semiconductor device 800 according to an eighth embodiment of the present invention. In the eighth embodiment is different from the first embodiment in that a metal source/drain layer 45 also functions as a source/drain diffusion layer. Therefore, the semiconductor device 800 has no source-drain layer 40. The other configuration in the eighth embodiment may be the same as that in the first embodiment.

In the eighth embodiment, the first embodiment is applied to an n-type Schottky MIS transistor. In the n-type Schottky MIS transistor, the metal source/drain layer 45 consists of a rare earth metal typified by erbium (Er) or silicide containing such a metal. This is because the rare earth metal typified by erbium (Er) has a high Schottky barrier to electrons. In this manner, a source-drain resistance decreases.

In a p-type Schottky MIS transistor, the metal source/drain layer 45 consists of, for example, a noble metal typified by platinum (Pt) or silicide containing such a metal. This is because the noble metal silicide has a low Schottky barrier with reference to holes.

The first and second gate electrodes 11 and 12 consist of silicide containing the same rare earth metal as that in the metal source/drain layer 45. In this manner, the work functions of the first and second gate electrodes 11 and 12 are almost equal to the work function of n-type polysilicon which is popularly applied as a gate electrode at the present. As a result, a current circuit design need not be largely changed.

(Ninth Embodiment)

Figure 35:
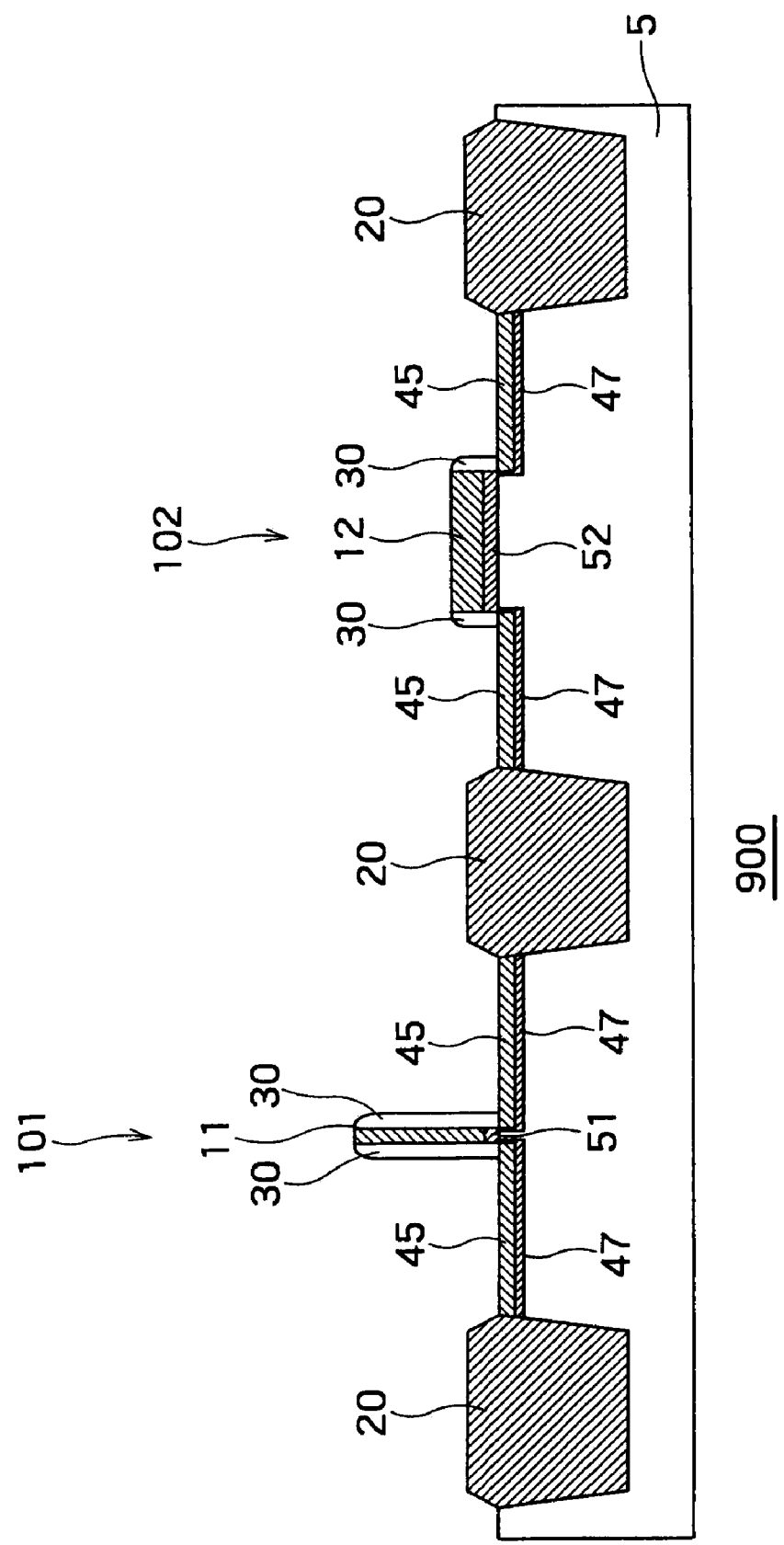
FIG. 35 is a sectional diagram of a semiconductor device 900 according to a ninth embodiment of the present invention.

FIG. 35 is a sectional diagram of a semiconductor substrate 900 according to a ninth embodiment of the present invention. The ninth embodiment is different from the eighth embodiment in that a high-concentration layer 47 is formed around the metal source/drain layer 45. The high-concentration layer 47 has an impurity concentration higher than that of a well diffusion layer formed on the semiconductor substrate 900 or the semiconductor substrate 5. The high-concentration layer 47 has a thickness smaller than that of the metal source/drain layer 45. The high-concentration layer 47 contains, for example, phosphorous (P), arsenic (As), or boron (B) as an impurity. As a mode in the embodiment, the high-concentration layer 47 desirably has an impurity concentration of about $10^{20}$ cm$^{-3}$ or more and a thickness of about 10 nm or less. Alternatively, the impurity concentration of the high-concentration layer 47 may be about $10^{20}$ cm$^{-3}$ or more, and the thickness of the side wall 30 may be about 10 nm or less. The other configuration in the ninth embodiment is the same as that in the eighth embodiment. However, as the metal source/drain layer 45, a mid-gap metal such as cobalt silicide or nickel silicide can also be used. This is because the high-concentration layer 47 is arranged around the metal source/drain layer 45 to lower a Schottky barrier between the source/drain layer and the semiconductor substrate 5.

In order to form the metal source/drain layer 45, impurity is shallowly implanted by ion implantation or the like in advance, and a metal is sputtered, and then silicidation is performed. In this manner, an impurity which is present in a portion of the metal source/drain layer 45 is segregated around the metal source/drain layer 45 during the silicidation. For example, the segregation of the impurity can form the high-concentration layer 47.

The eighth and ninth embodiments can be applied to any one of the first to seventh embodiments.

The above embodiments can be applied to a complete-depletion type transistor using SOI or a three-dimensional device typified by an FiNFET. In particular, in the three-dimensional device such as an FiNFET, since a gate electrode structure is further complicated, the embodiments are effective.

(Tenth Embodiment)

Figure 36:
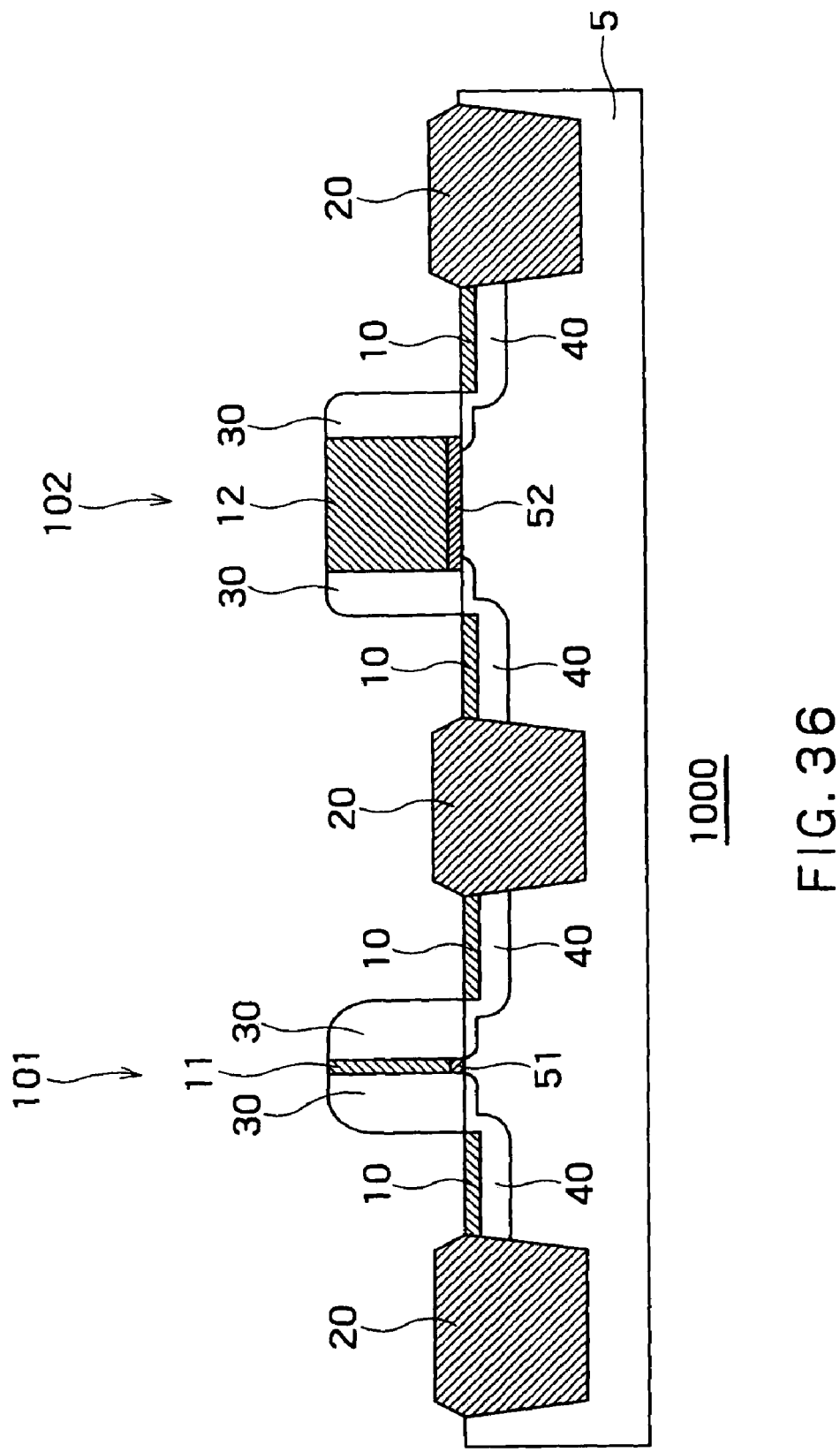
FIG. 36 is a sectional diagram of a semiconductor device 1000 according to a tenth embodiment of the present invention.

FIG. 36 is a sectional diagram of a semiconductor device 1000 according to a tenth embodiment of the present invention. In the tenth embodiment, a first gate electrode 11 consists of $Ni_2Si$. The thickness (height) of a second gate electrode 12 is equal to that of the first gate electrode 11. The thickness of the second gate electrode 12 is 50 nm, for example. The other configuration in the tenth embodiment may be the same as that in the first embodiment.

When the second gate electrode 12 having a large gate length is fully silicided, the first gate electrode 11 having a small gate length is changed into $Ni_2Si$ by a reverse thin-line effect.

The work function increases as a nickel content increases. Therefore, in the silicidation step, the thickness of the nickel film is controlled to make it possible to control the work function. For example, a nickel film 80 having a thickness of 50 nm or more is deposited on first and second gate electrodes 61 and 62 each having a thickness of 50 nm. The thickness of the nickel film 80 is preferably equal to or larger than the thicknesses (heights) of the first and second gate electrodes 61 and 62. This is because the second gate electrode 62 can be changed into $NiSi_2$ and the first gate electrode 61 can be changed into NiSi or $Ni_2Si$.

(Eleventh Embodiment)

FIG. 37 is a sectional diagram of a semiconductor device 1100 according to the eleventh embodiment of the present invention. In the eleventh embodiment, a first gate electrode 11 has a two-layer structure constituted by an $Ni_2Si$ layer 15 and an Ni(SiGe) layer 16. The thickness (height) of a second gate electrode 12 is equal to that of the first gate electrode 11. The thickness of the second gate electrode 12 is 50 nm, for example. The other configuration in the eleventh embodiment may be the same as that in the first embodiment.

In the eleventh embodiment, germanium is added to only the first gate electrode 11. The germanium may be added by using polycrystalline SiGe in place of a polysilicon layer 31 or by implanting germanium ions into the polysilicon layer.

According to the eleventh embodiment, in a silicide forming step, germanium is concentrated toward a first gate insulation film 51 in the first gate electrode 11. Therefore, the Ni(SiGe) layer 16 is formed on the first gate insulation film 51. For this reason, a reverse thin-line effect can be suppressed.

Furthermore, if a germanium content of the Ni(SiGe) layer 16 near the first gate insulation film 51 is 60% or more, the work function continuously changes from NiSi (4.7 ev) to NiGe (5.2 eV). Therefore, the work function of the gate electrode can be controlled by controlling the germanium content.

In the above embodiments, although silicon is used in a channel region, a material such as SiGe, Ge, or strain Si which has a carrier mobility higher than that of silicon may be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A method of manufacturing a semiconductor device comprising:
    preparing a semiconductor substrate having a semiconductor surface region comprising a first surface region and a second surface region;
    epitaxially growing a semiconductor region directly on the second surface region;
    forming a first gate insulation film directly on the first surface region and forming a second gate insulation film on the semiconductor region;
    forming a first silicon layer above the first gate insulation film, and forming a second silicon layer above the second gate insulation film, an upper surface of the first silicon layer having a height equal to that of the second silicon layer, the first silicon layer having a thickness larger than that of the second silicon layer, and at least one of a gate length and a gate width of the first silicon layer being shorter than the gate length or gate width of the second silicon layer, respectively; and
    depositing a metal film on the first silicon layer and on the second silicon layer.

2. The method according to claim 1, wherein
    a gate length or a gate width of the first silicon layer is less than 50 nm, and
    a gate length or a gate width of the second silicon layer is more than 50 nm.

3. The method according to claim 1, wherein
    a gate length of the first silicon layer is less than 50 nm,
    a gate length of the second silicon layer is more than 50 nm, and
    a gate width of the first silicon layer is equal to the gate width of the second silicon layer.

4. The method according to claim 1, wherein an area of the upper surface of the first silicon layer is larger than an area of the second silicon layer.

5. The method according to claim 1, further comprising:
    forming a first source/drain on both sides of the first silicon layer and forming a second source/drain both sides of the second silicon layer;
    covering the first source/drain and the second source/drain with an interlayer insulation film;
    polishing the interlayer insulation film to expose the upper surface of the first silicon layer and the upper surface of the second silicon layer.

6. The method according to claim 1, further comprising:
    forming first source/drain regions on both sides of the first silicon layer and forming second source/drain regions on both sides of the second silicon layer by introducing impurities;
    depositing a metal film on the first source/drain regions and on the second source/drain regions; and
    segregating the impurities around the first source/drain regions and the second source/drain regions by siliciding the first source/drain regions and the second source/drain regions.

7. The method according to claim 1 further comprising fully siliciding the first silicon layer and the second silicon layer.

* * * * *